United States Patent
Ikuta et al.

[11] Patent Number: 5,844,410
[45] Date of Patent: Dec. 1, 1998

[54] DEVICE FOR OPTICALLY MEASURING PHYSICAL QUANTITY IN POWER EQUIPMENT AND METHOD OF MANUFACTURING THE SAME

[75] Inventors: Sakae Ikuta, Tokyo; Kiyohisa Terai, Yokohama; Masao Takahashi, Fujisawa; Keiko Matsumoto, Kyoto, all of Japan

[73] Assignee: Kabushiki Kaisha Toshiba, Kawasaki, Japan

[21] Appl. No.: 785,272

[22] Filed: Jan. 21, 1997

[30] Foreign Application Priority Data

Jan. 22, 1996 [JP] Japan .................................. 8-008031

[51] Int. Cl.$^6$ .................................................. G01R 31/00
[52] U.S. Cl. .......................................... 324/96; 324/117 R
[58] Field of Search .................................. 321/244.1, 96; 324/117 R, 127

[56] References Cited

U.S. PATENT DOCUMENTS

| | | | |
|---|---|---|---|
| 3,621,390 | 11/1971 | Von Willisen | 324/96 |
| 4,529,875 | 7/1985 | Brogardh et al. | 324/96 |
| 4,797,607 | 1/1989 | Dupraz | 324/96 |
| 4,914,382 | 4/1990 | Douville et al. | 324/127 |
| 4,967,145 | 10/1990 | Davies | 324/127 |
| 4,998,063 | 3/1991 | Miller | 324/96 |
| 4,999,571 | 3/1991 | Ishiko et al. | 324/96 |
| 5,136,236 | 8/1992 | Bohnert et al. | 324/96 |
| 5,202,629 | 4/1993 | Seike et al. | 324/96 |
| 5,295,207 | 3/1994 | Dupraz et al. | 324/96 |

FOREIGN PATENT DOCUMENTS 2 613 838  10/1988  France .

OTHER PUBLICATIONS

IEEE Transactions on Power Delivery, vol. 5, No. 2, pp. 884–891, Apr. 1990, T. Sawa, et al., "Development of Optical Instrument Transformers".

*Primary Examiner*—Frank G. Font
*Assistant Examiner*—Zandra V. Smith
*Attorney, Agent, or Firm*—Oblon, Spivak, McClelland, Maier & Neustadt, P.C.

[57] ABSTRACT

A device for optically measuring a physical quantity in power equipment includes an optical fiber associated with the power equipment, an optical part for transmitting/receiving light to/from the optical fiber, calculation unit for calculating a physical quantity in the power equipment by detecting the polarized state of light polarized by the power equipment on the basis of the output from the optical part, a housing box for housing the optical part, and a fixing member to which the optical part is mounted and which is fixed to the housing box by laser welding.

19 Claims, 14 Drawing Sheets

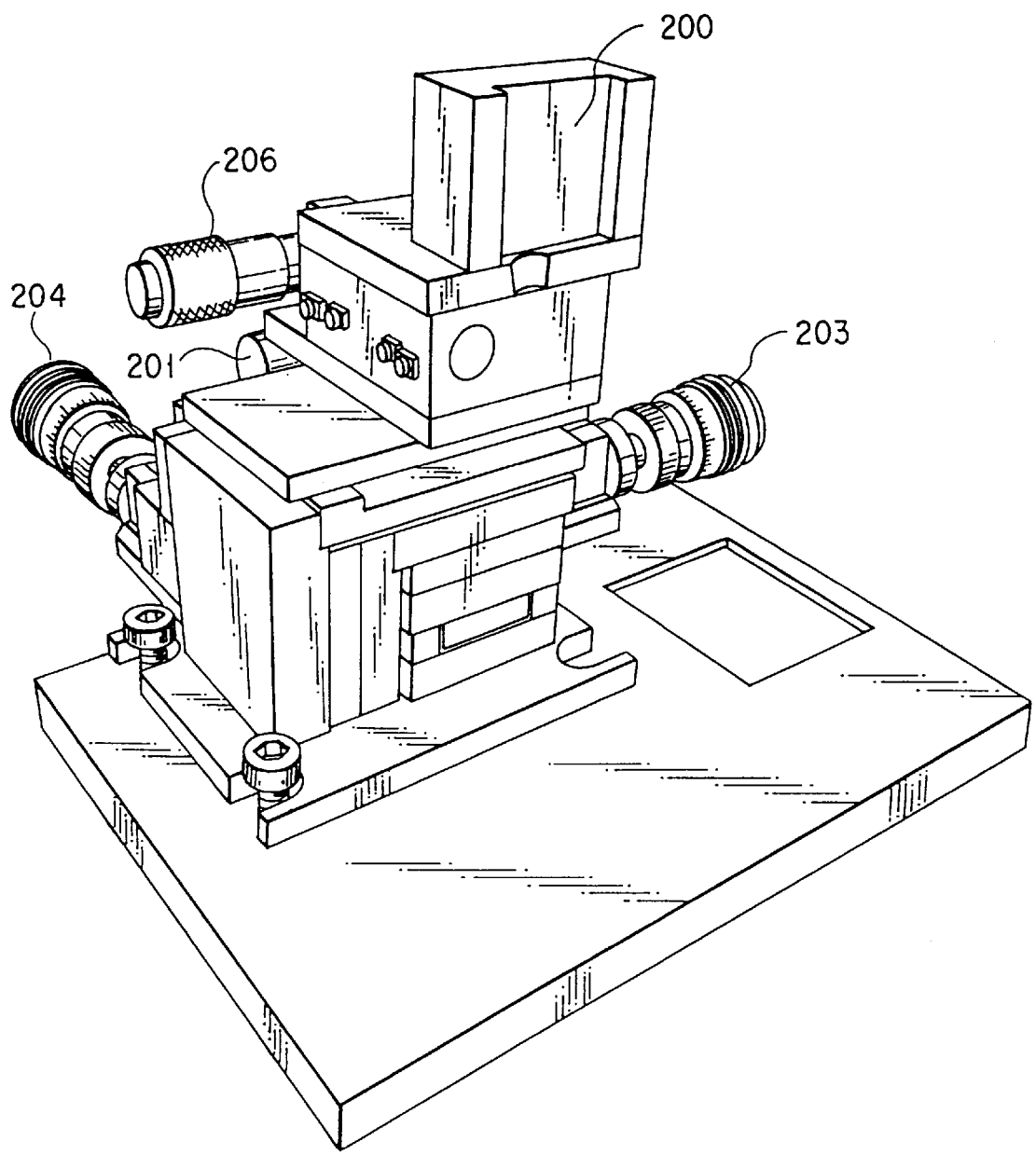
F I G. 6B

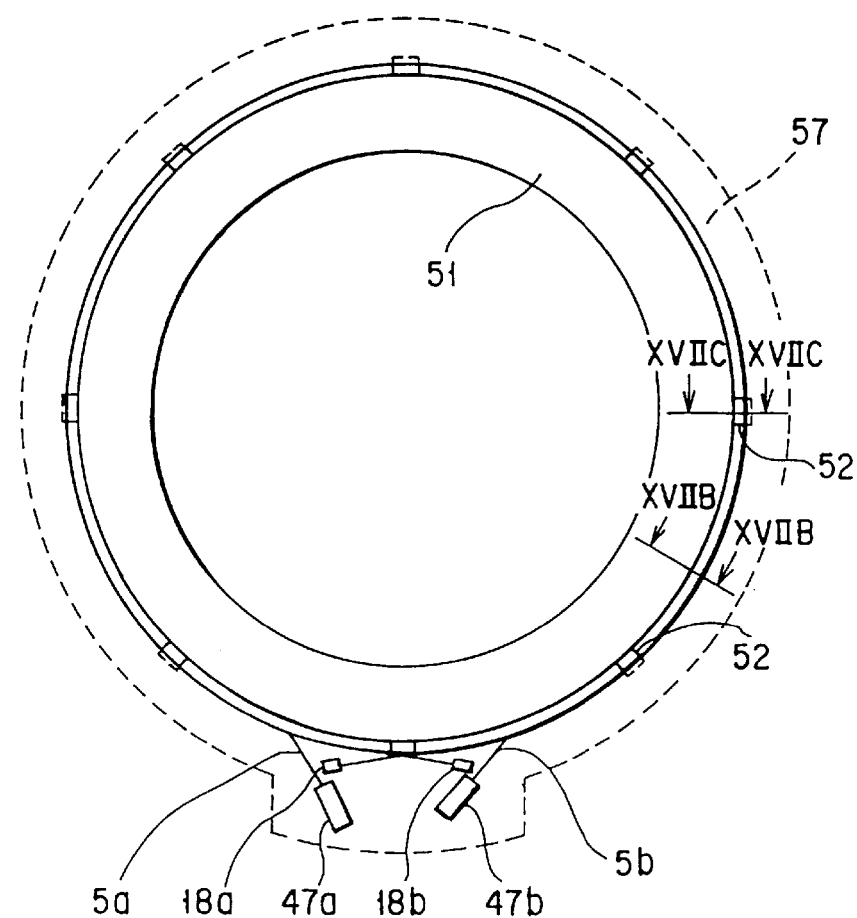
F I G. 17A
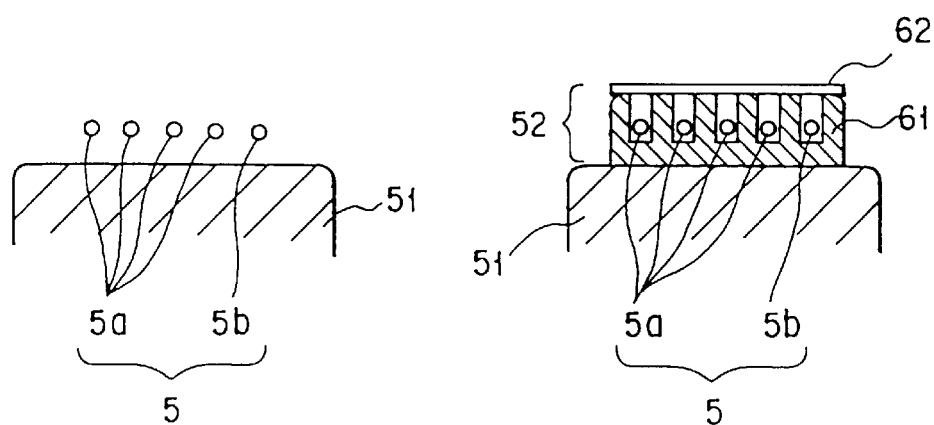
F I G. 17B	F I G. 17C

DEVICE FOR OPTICALLY MEASURING PHYSICAL QUANTITY IN POWER EQUIPMENT AND METHOD OF MANUFACTURING THE SAME

BACKGROUND OF THE INVENTION

The present invention relates to an optical current measuring device applied to a power system and, more particularly, to a device for optically measuring a physical quantity such as temperature, electric field, magnetic field, current, or voltage in power equipment, and a method of manufacturing the same.

As a conventional device for measuring current as a physical quantity in power equipment such as a GCB (Gas Circuit Breaker), a CT (Current Transformer) using electromagnetic induction is available. In addition to such a current transformer using electromagnetic induction, a current measuring device using a fiber based on polarization of light is available. This current measuring device using polarization of light (optical current measuring device) measures polarized light by using the Faraday effect that the rotational angle of polarized light changes in the presence of a magnetic field, the optical elasticity effect that birefringence occurs due to a stress, or the like, thereby measuring a physical quantity, e.g., magnetic field, electric field, voltage, current, strain, or temperature.

FIG. 1 shows a state wherein a current transformer 101 as a current measuring device using electromagnetic induction, and a current measuring device (optical current measuring device) 102 similarly using electromagnetic induction are mounted on a GCB 100. As shown in FIG. 1, the current measuring device 102 using an annular optical fiber is smaller than the current transformer 101, and hence greatly contributes to space savings for a generating station such as a substation.

In this optical current measuring device, the current signal output has no dependence on the light signal intensity. For this reason, the device can perform high-precision current measurement without causing any error due to, for example, a change in light amount which is caused when a misalignment or a deterioration in light source occurs. In addition to the above merit of space savings, such an optical current measuring device has excellent insulating properties and a compact structure. For this reason, it is expected that the device will have higher performance, serving as a current measuring device especially for high-voltage equipment in a power system.

Conventionally, for example, the optical system ranging from the transmission optical fiber to reception optical fibers in the above optical current measuring device has a structure like the one shown in FIGS. 2 and 3. As shown in FIG. 2, a plurality of optical parts constituting an optical system ranging from a transmission fiber 3 to two reception fibers 8 are mounted on an elongated optical system mount board 13 except for the optical fibers. A circular mount portion 13a through which a conductor 6 extends is mounted on one end of the optical system mount board 13 in the longitudinal direction. The current to be measured flows through the conductor 6. A sensor optical fiber (sensor fiber) 5 is wound around the mount portion 13a. The two end portions of the sensor fiber 5 are disposed to be parallel to each other and located at the same position along the longitudinal direction of the optical system mount board 13. A polarizer 4, a lens 2, and the exit end portion of the transmission fiber 3 are disposed in a row on the extended line of the incident end portion of the sensor fiber 5. An analyzer 7, a lens 2, and the incident end portion of the first reception fiber 8 are disposed in a row on the extended line of the exit end portion of the sensor fiber 5. The polarizer 4 is disposed such that its polarization azimuth makes 45° with the horizontal or vertical direction. The analyzer 7 is an optical part for splitting incident light polarized in an arbitrary direction into two linearly polarized light beams polarized in the horizontal and vertical directions, and outputs the beams in different directions. In the structure shown in FIG. 2, the analyzer 7 is disposed to output the above beams in the longitudinal direction of the optical system mount board 13 and a direction perpendicular thereto (toward the polarizer 4).

The incident end portion of the second reception fiber 8 is disposed between the exit end portion of the transmission fiber 3 and the incident end portion of the first reception fiber 8 to be parallel thereto. In order to guide light emerging from the analyzer 7 at 90° to the incident end portion of the second lens 2 disposed in this manner, a deflecting mirror 14 for deflecting the optical path by 90° is disposed between the analyzer 7 and the polarizer 4.

Fiber connectors 15 are attached to the respective end portions of the fibers 3, 5, and 8 disposed in this manner to support the fiber end portions. The respective fiber connectors 15 and the respective lenses 2 coupled to the fibers 3, 5, and 8 are mounted on different mount members 16 in a predetermined positional relationship wherein the respective optical axes coincide with each other. Each mount member 16 is made of a metal and fixed on the optical system mount board 13 with an adhesive 17, as shown in FIG. 3. Similarly, the polarizer 4, the analyzer 7, and the deflecting mirror 14 are fixed on the optical system mount board 13 with the adhesive 17. The surface of the optical system mount board 13 on which the optical parts are fixed in this manner is covered with a lightweight, simple cover whose weight poses no problem, thereby forming an optical system housing box, as a whole.

The optical system shown in FIGS. 2 and 3 and having the above arrangement operates as follows. In this optical system, each of the structures constituted by the fiber connectors 15 for the fibers 3, 5, and 8, the mount members 16, and the lenses 2 serves as a collimator for converting light from the fiber into a parallel light beam or focusing a parallel beam to cause it to be incident on the fiber.

Light emitted from a light source (not shown) is guided by the transmission fiber 3 and converted into a parallel light beam by the collimator at the exit end portion of the transmission fiber 3. The parallel light beam reaches the polarizer 4. In this case, as described above, since the polarizer 4 is placed such that its polarization azimuth makes 45° with the horizontal or vertical direction, the light is converted into linearly polarized light of an azimuth angle of 45° by the polarizer 4. This light is brought to a focus by the collimator at the incident end portion of the sensor fiber 5. This focused light beam is incident on the sensor fiber 5.

The light incident on the sensor fiber 5 undergoes Faraday rotation owing to a magnetic field generated by a current (to be measured) flowing through the conductor 6, while propagating through the sensor fiber 5. As a result, the azimuth of the light changes. Thereafter, the light is converted into a parallel light beam by the collimator at the exit end portion of the sensor fiber 5 and incident on the analyzer 7. The analyzer 7 splits the light into linearly polarized light component ($\underline{x}$ component) polarized in the horizontal direction and linearly polarized light component ($\underline{y}$ component) polarized in the vertical direction. Of the two light components split in this manner, one light component is incident on one of the collimators at the incident end portions of the two reception fibers 8. The other light component is incident on the other collimator at the incident end portion of the other reception fiber 8 through the deflecting mirror 14. The light components incident on the collimators are focused, and the focused light beams are incident on the respective reception fibers 8.

In the operation of the above optical system, each optical part must be positioned with a high precision. In this case, the optical system mount board 13 serves to accurately hold/fix each optical part at a predetermined position. As described above, each optical part is mounted on the optical system mount board 13 with the adhesive 17. More specifically, each optical part is mounted by the following procedure. In mounting an optical part, the lower surface of the optical part is coated with an adhesive. In this state, the optical part is positioned on the optical system mount board 13 while being held by a fine adjustment unit. The optical part is then bonded/fixed at the position.

In the conventional optical current measuring device shown in FIGS. 2 and 3, however, the following problems are posed.

(1) Positional shifts or detachment of optical parts may occur due to the adhesive.

(2) A positional shift may occur between the optical fiber and the focusing optical system for sending light to the optical fiber, and a change in light amount may then occur due to the positional shift.

(3) A deterioration in precision may occur owing to the influences of ambient conditions such as temperature, humidity, and external magnetic fields and stress.

(4) A change in light amount may occur owing to foreign substances adhering to the end face of the optical fiber.

(5) A light loss may be caused by a bend in the reception fiber.

The detailed contents of problems (1) to (5) will be described below.

(1) "Positional Shifts or Detachment of Optical Parts Due to Adhesive"

As shown in FIGS. 2 and 3, conventionally, each optical part of an optical system is only fixed to the optical system mount board 13 as a portion of the optical system housing box with an adhesive by using a fixing member such as the mount member 16. In this case, since the coefficient of thermal expansion of the adhesive is generally 10 times or more larger than those of metal or glass materials, when the ambient temperature greatly changes, the adhesive greatly contracts. As a result, the positions of the optical parts shift from each other. In addition, when the optical system is exposed to repeated changes in temperature or vibrations, the adhesive deteriorates owing to the synergistic effect of the above great contraction and external mechanical force. For this reason, optical parts may be detached after a long period of use.

(2) "Positional Shift between Optical Fiber and Focusing Optical System for Sending Light to Optical Fiber, and Change in Light Amount due to Positional Shift"

Since the core diameter of the optical fiber is very small, alignment with a very high precision is required between such an optical fiber and the focusing optical system for sending light to the optical fiber. If, however, vibrations or changes in temperature occur, or contraction of the adhesive occurs, the alignment between the sensor and the focusing optical system is disturbed, and the amount of light incident on the sensor may greatly change. Such a change in light amount leads to a deterioration in measurement precision.

As an optical fiber constituting a sensor fiber, in particular, a single-mode optical fiber is used because polarization information must be transmitted therethrough. However, since the core diameter of such a single-mode optical fiber is as small as about 2 to 10 $\mu$m, alignment easily deteriorates owing to vibrations, changes in temperature, contraction of the adhesive, or the like. If the alignment deteriorates considerably, light may cease to be incident on the sensor fiber.

Assume that a change in light amount occurs at each portion of the optical system. Even in this case, if a certain amount of light can be ensured, the light amount change caused at a portion, of the optical system, which is located before the analyzer can be corrected by an electronic circuit. It is, however, difficult to correct a light amount change caused at a portion located after the analyzer by using the electronic circuit, because $\underline{x}$ and $\underline{y}$ components are not in phase. Such a light amount change therefore causes an error.

In this case, since a multimode optical fiber can be used as an optical fiber constituting a reception fiber, it is relatively easy to cause light to be incident on the fiber as compared with the sensor fiber using the above single-mode optical fiber. As described above, however, since it is difficult to correct light amount changes caused after the analyzer, even a slight change in the amount of light incident on the reception fiber directly leads to an error.

(3) "Deterioration in Precision owing to Influences of Ambient Conditions such as Temperature, Humidity, and External Magnetic Fields and Stress"

Optical parts are basically susceptible to the influences of ambient conditions such as temperature, humidity, and external magnetic fields. The optical system cannot be satisfactorily protected from these ambient conditions with the structure shown in FIGS. 2 and 3, in which the optical parts are mounted on the optical system mount board 13, and the optical system mount board 13 is covered with a simple cover. For this reason, especially the optical characteristics of optical parts other than the sensor fiber change owing to the influences of ambient conditions. As a result, light passing through these optical parts may undergo an error.

In the optical current measuring device, as shown in FIGS. 2 and 3, the sensor fiber is wound around the fixing member (the mount portion 13a of the optical system mount board 13 in FIGS. 2 and 3) placed around the conductor through which the current to be measured flows. If, however, the sensor fiber is firmly fixed to the fixing member, a large stress is applied from the fixing member to the sensor fiber with a change in temperature, resulting in an error.

(4) "Change in Light Amount owing to Foreign Substances adhering to End Face of Optical Fiber"

Since the core diameter of the optical fiber is very small, when a foreign substance adheres to the end face of the fiber, a light amount loss occurs. As described above, the single-mode optical fiber constituting the sensor fiber, in particular, has a diameter as small as about 2 to 10 $\mu$m. For this reason, even a minute foreign substance adhering to the end face will cause a large light amount loss, resulting in an error.

(5) "Light Loss Caused by Bend in Reception Fiber"

It is desirable that the reception fiber guide 100% of incident light to a detector. However, the light partly leaks from a bent portion of the fiber, resulting in a light loss. It is, however, generally difficult to dispose the reception fiber without bending it, in consideration of the fiber layout of the device. For this reason, a bend in the reception fiber inevitably causes such a light loss.

Note that problems (1) to (5) described above are not limited to the optical current measuring device shown in FIGS. 2 and 3, and are generally posed in optical measuring devices for measuring various types of physical quantities by using optical systems including optical fibers.

BRIEF SUMMARY OF THE INVENTION

It is an object of the present invention to provide a highly practical optical measuring device which exhibits high precision and stability for a long period of time.

More specifically, it is an object of the present invention to achieve the following object. That is, it is an object of the present invention to provide an excellent method of manufacturing a device for optically measuring a physical quantity, which includes an optical system exhibiting high precision and stability for a long period of time and allowing the optical parts of the optical system to be easily and reliably fixed with sufficient durability.

It is another object of the present invention to provide a device for optically measuring a physical quantity, which includes an optical system that is unaffected by surroundings such as temperature, humidity, and external magnetic fields, and exhibits high precision and stability for a long period of time.

It is still another object of the present invention to provide a device for optically measuring a physical quantity, which includes a high-precision optical system capable of preventing a change in the amount of light incident on an optical fiber and adhesion of foreign substances on optical fiber end faces, and exhibiting high stability of the light amount.

It is still another object of the present invention to provide a device for optically measuring a physical quantity, which includes a high-precision optical system capable of reducing the light loss due to a bend in a reception fiber and exhibiting high stability of the light amount.

It is still another object to provide an optical measuring device which includes a high-precision, compact, simple sensor fiber and can reduce the influences of external conditions such as a stress on the sensor fiber, and more specifically, a device for optically measuring a physical quantity, which is suitably used for a power system.

In order to achieve the above objects, there is provided a method of manufacturing a device for optically measuring a physical quantity in power equipment, comprising the steps of providing an optical fiber associated with the power equipment, providing an optical part for transmitting/receiving light to/from the optical fiber, providing calculation means for calculating a physical quantity in the power equipment by detecting a polarized state of light polarized by the power equipment on the basis of an output from the optical part, providing a housing box for housing the optical part, attaching the optical part to a fixing member, and fixing the fixing member to the housing box by laser welding.

In order to achieve the above objects, there is provided a device for optically measuring a physical quantity in power equipment, comprising an optical fiber associated with the power equipment, an optical part for transmitting/receiving light to/from the optical fiber, calculation means for calculating a physical quantity in the power equipment by detecting a polarized state of light polarized by the power equipment on the basis of an output from the optical part, a housing box for housing the optical part, and a fixing member to which the optical part is mounted and which is fixed to the housing box by laser welding.

In order to achieve the above objects, there is provided a device for optically measuring a physical quantity in power equipment by using an optical fiber, comprising a mount member arranged for the power equipment, having a size larger than a diameter of the optical fiber, and having a fixing portion in which a groove portion in which the optical fiber is housed is formed, the optical fiber housed in the groove portion of the fixing portion of the mount member, and means for detecting a polarized state of light polarized by the power equipment by transmitting/receiving light to/from the optical fiber, and calculating a physical quantity in the power equipment on the basis of the detection output.

The above methods and apparatuses are further defined by the following conceptions. The conceptions give concrete forms to the present invention and also abstract it. Conceptions 1 to 8 are associated with improvements in the method of manufacturing an optical system and the arrangement of the optical system. Conceptions 9 to 13 are associated with improvements in the optical fiber and the arrangement of a focusing means for sending light to the optical fiber. Conceptions 14 to 17 are associated with improvements in the arrangement of the reception optical fiber. Conceptions 18 to 27 are associated with improvements in the fixing structure for the sensor optical fiber. Conceptions 28 to 32 are associated with optical current measuring devices to which conceptions 18 to 27 are applied. The respective conceptions will be sequentially described below.

(Method of Manufacturing Optical System and Its Arrangement)

Conceptions 1 to 8 include the following novel constructions in an optical measuring device which includes an optical system constituted by a plurality of optical parts including a sensor optical element, a plurality of fixing members, to each of which at least one optical part selected from the plurality of optical parts of the optical system is attached, and an optical system housing box to which the plurality of fixing members are fixed to house the optical parts, and is designed to obtain a physical quantity as an object to be measured by detecting the polarized state of light passing through the sensor optical element, and a method of manufacturing the same.

According to conception 1, in the method of manufacturing the above optical measuring device, the fixing member and the optical system housing box are fixed to each other by laser welding.

According to conception 1 having the above arrangement, the optical parts can be fixed firmly and stably by laser welding. In addition, since laser welding is a noncontact process, and the heat gain is small, the optical parts can be assembled without applying any force, and the thermal strain on the overall optical system can be sufficiently reduced. Therefore, there is no possibility of positional shifts and detachment of the optical parts, and the high-precision optical system can be maintained in a stable state for a long period of time, unlike the prior art.

According to conception 2, in the optical measuring device, at least the fixing portions of the fixing member and the optical system housing box are made of a metal containing no phosphorus, and fixed by laser welding.

According to conception 3, in the optical measuring device, the optical system housing box is made of a magnetic metal, and the fixing member and the optical housing box are fixed to each other by laser welding.

According to conception 4, at least the fixing portions of the fixing member and the optical system housing box in conception 3 are made of a metal containing no phosphorus. According to conception 5, the metal containing no phosphorus in conception 2 or 4 is nickel alloy steel.

According to conception 6, the magnetic metal in conception 3 is nickel alloy steel.

According to conception 7, the nickel content of the nickel alloy steel in conception 5 or 6 is 30 to 40%.

According to conception 8, the plurality of optical parts of the optical system in conceptions 2 to 7 include an optical fiber, and the optical system housing box houses the plurality of optical parts of the optical system except for the optical fiber.

According to conceptions 2 to 8 with the above arrangement, since the device is manufactured by the method according to conception 1, the following effects can be obtained in addition to the same effects as those obtained by conception 1.

According to conceptions 2 and 4, since at least the fixing portions of the fixing member and the optical system housing box are made of a metal, highly reliable fixing portions can be formed without adhesion of foreign materials or production of cracks, thereby increasing the fixing strength of the optical parts and improving their stability.

According to conceptions 3 and 4, since the optical system housing box is made of a magnetic metal, the optical parts housed in the box can be shielded from external magnetic fields. Therefore, the influences of errors and noise caused by external magnetic fields can be reduced.

The nickel alloy steel used in conceptions 5 to 7 is a magnetic metal containing no phosphorus and suitable for laser welding. In conception 7, in particular, nickel alloy steel containing 30 to 40% of nickel is used. Since the coefficient of thermal expansion of this nickel alloy steel is much lower than the coefficients of thermal expansion of other metals, a high temperature stability of the overall optical system can be ensured.

According to conception 8, since the optical parts of the optical system, other than the optical fiber, are housed in the optical system housing box, the optical system housing box can be reduced in size and simplified.

(Arrangements of Optical Fiber and Focusing Means for Sending Light to Optical Fiber)

Conceptions 9 to 13 include the following novel constructions in an optical measuring device which includes an optical fiber for guiding light, an optical system constituted by a plurality of optical parts including a focusing means for sending light to the optical fiber, and a sensor section formed at a portion of the optical system, and is designed to obtain a physical quantity to be measured by detecting the polarized state of light passing through the sensor section.

According to conception 9, the spot size of light incident on the end face of the optical fiber of the focusing means is set to be $2^{1/2}$ or more the core diameter of the optical fiber.

According to conception 10, the spot size of light incident on the end face of the optical fiber of the focusing means is set to be $2^{-1/2}$ or less the core diameter of the optical fiber.

According to conceptions 9 and 10, the spot size of light incident on the end face of the optical fiber is set to be larger or smaller than the core diameter of the optical fiber to reduce a change in the amount of light incident on the fiber with a change in alignment.

According to conception 11 having the above arrangement, by using a distributed index lens for a focusing means for sending light to the optical fiber, a high coaxiality can be easily obtained between the periphery of the lens and the optical center of the lens, and a given distance can be easily set between the lens end face and the fiber end face by a mechanical process. An improvement in alignment precision can therefore be attained.

According to conception 12, the focusing means is constituted by a lens, and the focal point of the lens is set to coincide with the lens end face.

According to conception 12 with the above arrangement, since the arrangement is designed such that a lens is used for the focusing means for sending light to the optical fiber, and the focal point of the lens is set to coincide with the lens end face, the optical fiber and the lens can be disposed in a butting arrangement. Since these components butt against each other, the optical fiber and the lens can be set under the same vibration condition. Therefore, a change in light amount can be suppressed, and an improvement in light amount stability can be attained.

According to conception 13, a fiber connector for supporting the fiber end portion is placed at the end portion of the optical fiber, and the lens has the same diameter as that of the fiber connector.

According to conception 13 with the above arrangement, in addition to the effects in conceptions 11 and 12, an improvement in coaxiality between the optical fiber and the lens can be attained, and a further improvement in alignment precision can be attained by setting the diameter of the fiber connector to be equal to that of the lens.

(Reception Optical Fiber)

Conceptions 14 to 17 have the following novel constructions in an optical measuring device which includes a sensor optical element, an analyzer through which transmitted light undergoes a change in amount depending on the polarized state of the light emerging from the sensor optical element, a reception optical fiber for guiding the light transmitted through the analyzer, and an optical system constituted by a plurality of optical parts including a focusing means for sending light to the reception optical fiber, and is designed to obtain a physical quantity to be measured by detecting the amount of light guided by the reception optical fiber.

According to conception 14, the reception optical fiber is constituted by a multimode optical fiber having a core diameter of 100 $\mu$m or more.

According to conception 14 with the above arrangement, by using a multimode optical fiber having a large diameter as the reception optical fiber, a change in the amount of light incident on the fiber with a change in alignment can be reduced.

According to conception 15, the reception optical fiber is constituted by a multimode optical fiber having an NA of 0.25 or more.

According to conception 15 with the above arrangement, by using a multimode optical fiber having a high NA as the reception optical fiber, a light loss due to a bend in the fiber can be reduced, and a change in the amount of light reaching the detector can be reduced.

According to conception 16, the multimode optical fiber in conception 14 or 15 is made of multi-component glass.

According to conception 16 with the above arrangement, in addition to the effects in conception 14 or 15, a further increase in NA and a decrease in loss can be attained by using a multimode optical fiber made of multi-component glass as the reception optical fiber.

According to conception 17, the core of the multimode optical fiber in conception 14 or 15 is made of quartz, and the cladding is made of a plastic material.

According to conception 17 with the above arrangement, in addition to the effects in conception 14 or 15, a high transmittance can be realized in the infrared region because the core of the reception optical fiber is made of quartz and the cladding is made of a plastic material, and a high NA can be realized owing to the plastic cladding.

(Fixing Structure for Sensor Optical Fiber)

Conceptions 18 to 27 have the following novel constructions in an optical measuring device which includes a sensor optical fiber placed at a position where a physical quantity to be measured can be detected, and is designed to obtain the physical quantity by detecting the polarized state of light passing through the sensor optical fiber.

According to conception 18, an annular fixing member is placed at the position where the physical quantity can be detected, and the sensor optical fiber is wound around the annular fixing member. The annular fixing member includes a fixing portion for partly fixing the sensor optical fiber. This fixing portion has a groove portion in which the sensor optical fiber is housed. This groove portion has a size larger than the diameter of the sensor optical fiber.

According to conception 18 with the above arrangement, since the sensor optical fiber can be loosely and partly fixed to the annular fixing member, the influences of external magnetic fields can be reduced, and no large stress is applied to the fiber, unlike the case wherein the fiber is firmly fixed. For this reason, an increase in birefringence amount owing to such a stress can be suppressed. An improvement in measurement precision can therefore be attained.

According to conception 19, the fixing portion of the annular fixing member in conception 18 includes fixing portions distributed at a plurality of portions in the circumferential direction of the annular fixing member.

According to conception 20, only the two end portions of the sensor optical fiber in conception 18 or 19 are fixed with an adhesive.

According to conceptions 19 and 20 with the above arrangements, in addition to effects in conception 18, simplification of the structure can be realized, and the degree of freedom in design can be increased. In addition, since the sensor optical fiber can be fixed more loosely, an increase in birefringence amount due to a stress can be suppressed more.

According to conception 21, the sensor optical fiber in conceptions 18 to 20 is wound a plurality of turns, and the fixing portion of the annular fixing member is designed to fix the respective fiber portions of the sensor optical fiber while isolating the respective adjacent fiber portions from each other.

According to conception 21 with the above arrangement, the same effects as those in conceptions 18 to 20 can be obtained. In addition, the sensor optical fiber can be properly placed such that the respective fiber portions corresponding to the plurality of turns are loosely placed without interference with each other.

According to conception 22, the sensor optical fiber in conceptions 18 to 21 includes a plurality of sensor optical fibers constituting a plurality of sensors, and the fixing portion of the annular mount member is designed to fix the plurality of sensor optical fibers while isolating the adjacent fibers from each other.

According to conception 22 with the above arrangement, the same effects as those in conceptions 18 to 21 can be obtained. In addition, the plurality of sensor optical fibers constituting the plurality of sensors can be properly disposed without interference with each other while the respective fibers are loosely disposed. Since the plurality of sensors can be disposed on the single annular mount member altogether, in particular, the overall arrangement of the sensors can be reduced in size and simplified, as compared with the case wherein a plurality of sensors are disposed on different mount members.

According to conception 23, the fixing member of the annular mount member includes the plurality of groove portions, and the sensor optical fiber is housed in each groove portion.

According to conception 23 with the above arrangement, the fiber portions of a sensor optical fiber which correspond to the respective turns or a plurality of sensor optical fibers constituting a plurality of sensors can be easily placed in the plurality of groove portions formed in the fixing portion while they are isolated from each other. Therefore, the plurality of sensor portions corresponding to the respective turns or the plurality of sensors constituting the plurality of sensors can be loosely, properly, and easily disposed without interference with each other.

According to conception 24, the fixing portion of the annular mount member in conceptions 21 to 23 includes fiber guide portions. The fiber guide portions are housed in the groove portions to separately guide the respective fiber portions of the sensor optical fiber while isolating the adjacent fiber portions from each other.

According to conception 24 with the above arrangement, the fiber portions of a sensor optical fiber which correspond to a plurality of turns or a plurality of sensor optical fibers constituting a plurality of sensors can be easily disposed to be isolated from each other by using the fiber guide portions of the fixing portion. Therefore, fiber portions corresponding to a plurality of turns or a plurality of sensor optical fibers constituting a plurality of sensors can be properly and easily disposed to be isolated from each other without interference with each other.

According to conception 25, the fiber guide portions of the annular mount member in conception 24 are distributed at a plurality of portions in the circumferential direction of the annular mount member.

According to conception 26, the fiber guide portions of the annular mount member in conception 24 or 25 are a plurality of cylindrical guides arranged between the respective adjacent sensor optical fibers.

According to conceptions 25 and 26 with the above arrangements, in addition to the effects in conception 24, simplification of the structure and an increase in the degree of freedom in design can be attained. In addition, since the sensor optical fiber can be fixed more loosely, an increase in birefringence amount due to a stress can be suppressed more.

According to conception 27, the fixing portion of the annular mount member includes a plurality of disk-like housing portions stacked in the axial direction, and each disk-like housing portion has the above groove portion in the end face on one side in the axial direction.

According to conception 27 with the above arrangement, in addition to the effects in conception 21 or 22, standardization of disk-like housing portions and simplification of the structure of the fixing portion can be realized. By increasing the number of disk-like housing portions stacked on each other, in particular, the design can be easily changed. This structure therefore excels in practicability.

(Optical Current Measuring Device)

Conceptions 28 to 32 include the following novel constructions in an optical current measuring device which includes a sensor optical fiber placed near a conductor through which a current to be measured flows, and is designed to obtain a current flowing in the conductor by detecting the polarized state of light passing through the sensor optical fiber.

Conception 28 includes the arrangement of an optical measuring device selected from the optical measuring devices according to conceptions 18 to 27. The above annular mount member is placed to surround the conductor.

According to conception 28 with the above arrangement, the same effects as those in conceptions 18 to 27 can be obtained. In addition, the current to be measured which flows through the conductor can be measured with a high precision.

According to conception 29, the sensor optical fiber in conception 28 is designed such that the decrease in current measurement sensitivity is set to 10% or less.

According to conception 29 with the above arrangement, the same effects as those in conception 28 can be obtained. In addition, by setting the decrease in the current measurement sensitivity of the sensor optical fiber to 10% or less, the fiber is made less susceptible to external conditions. More specifically, a current measurement sensitivity S of the optical fiber at a measurement current limit of 0 A is given by the following equation:

$$S = \sin \delta / \delta$$

where $\delta$ (radian) is the birefringence of the optical fiber.

In this case, in order to set the current measurement sensitivity to 90% or more, the birefringence $\delta$ must fall within the range $\delta < 0.80$ radians, i.e., 45° or less. In general, the precision required for an optical current transformer used for measurement is ±1% or less at the rated current value. If the current measurement sensitivity S is 91% ($\delta = 0.74$) in the absence of the influences of external conditions, the required precision can be satisfied when the birefringence $\delta$ is 0.70 to 0.80. The function given by the above equation is influenced more by variations in $\delta$ as the current measurement sensitivity S decreases. For this reason, a high precision can be realized for the sensor optical fiber by setting the decrease in the current measurement sensitivity S to 10% or less.

In order to realize a high precision and high stability, the allowable precision width is preferably set to be equal to the width of the current measurement sensitivity S, and the current measurement sensitivity S is preferably set to 98% or more. The range of $\delta$ required in this case is 0 to 0.35 radians.

Note that the current measurement sensitivity S described in this case indicates that the Faraday rotational angle determined by a Verdet constant V decreases when multiplied by S. That is, a Faraday rotational angle $\Phi$ is given by the following equation:

$$\Phi = S \cdot m \cdot n V I$$

where $\underline{n}$ is the number of turns of the optical fiber around the conductor, and I is the value of the current flowing through the conductor.

In this case, $\underline{m}$ is 1 for a one-way optical path, and 2 when a two-way optical path.

According to conception 30, the conductor in conception 28 or 29 is placed in a tank filled with an insulating gas, and the sensor optical fiber is placed outside the insulating gas area and inside the current path in the tank.

According to conception 30 with the above arrangement, the same effects as those in conception 28 or 29 can be obtained. In addition, since the sensor optical fiber is placed outside the insulating gas area and inside the current path in the tank, the influences of generation of heat from the conductor and the influences of currents other than the current to be measured can be reduced. For this reason, the current flowing through the conductor can be accurately measured. Furthermore, since the sensor optical fiber is placed outside the gas area, the fiber can be easily handled.

According to conception 31, the conductor in conceptions 28 to 30 is placed in the tank filled with the insulating gas, the tank is constituted by a plurality of tanks connected to each other through an insulating spacer, and the annular fixing member is the insulating spacer.

According to conception 31 with the above arrangement, the same effects as those in conceptions 28 to 30 can be obtained. In addition, by using the insulating spacer for connecting the tanks to each other as a mount member for the sensor optical fiber, the power system can be reduced in size and simplified.

According to conception 32, the sensor optical fiber in conceptions 28 to 31 is constituted by a quartz fiber.

According to conception 23 with the above arrangement, the same effects as those in conceptions 28 to 31 can be obtained. In addition, since a quartz fiber is used as the sensor optical fiber, measurement can be performed up to a maximum current of $2 \times 2^{1/2} \times 63$ kA=178 kA, which is required for measurement in the power system, within the wavelength region (1.55 µm or less) used for a communication fiber, by setting the number of turns of the fiber to an integer multiple of 1 or more and the Faraday rotational angle $\Phi$ to 45° or less. That is, the condition for a current measuring device which is required for a power system can be satisfied.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A and 6B show a jig used to assemble a collimator, in which FIG. 6A is a perspective view showing the jig when viewed from the front surface side, and FIG. 6B is a perspective view showing the jig when viewed in the direction indicated by the arrow;

FIGS. 15A to 15C show a fixing structure for a sensor fiber according to the eighth embodiment of the present invention, in which FIG. 15A is a view showing the arrangement, FIG. 15B is a sectional view taken along a line XVB—XVB in FIG. 15A, and FIG. 15C is a sectional view taken along a line XVC—XVC in FIG. 15A;

FIGS. 16A to 16C show a modification of the fixing structure in FIGS. 15A to 15C, in which FIG. 16A is a view showing the arrangement, FIG. 16B is a sectional view taken along a line XVIB—XVIB in FIG. 16A, and FIG. 16C is a sectional view taken along a line XVIC—XVIC in FIG. 16A;

FIGS. 17A to 17C show another modification of the fixing structure in FIGS. 15A to 15C, in which FIG. 17A is a view showing the arrangement, FIG. 17B is a sectional view taken along a line XVIIB—XVIIB in FIG. 17A, and FIG. 17C is a sectional view taken along a line XVIIC—XVIIC in FIG. 17A;

FIGS. 18A to 18C show a fixing structure for a sensor fiber according to the ninth embodiment of the present invention, in which FIG. 18A is a view showing the arrangement, FIG. 18B is a sectional view taken along a line XVIIIB—XVIIIB in FIG. 18A, and FIG. 18C is a sectional view taken along a line XVIIIC—XVIIIC in FIG. 18A;

DETAILED DESCRIPTION OF THE INVENTION

Figure 4:
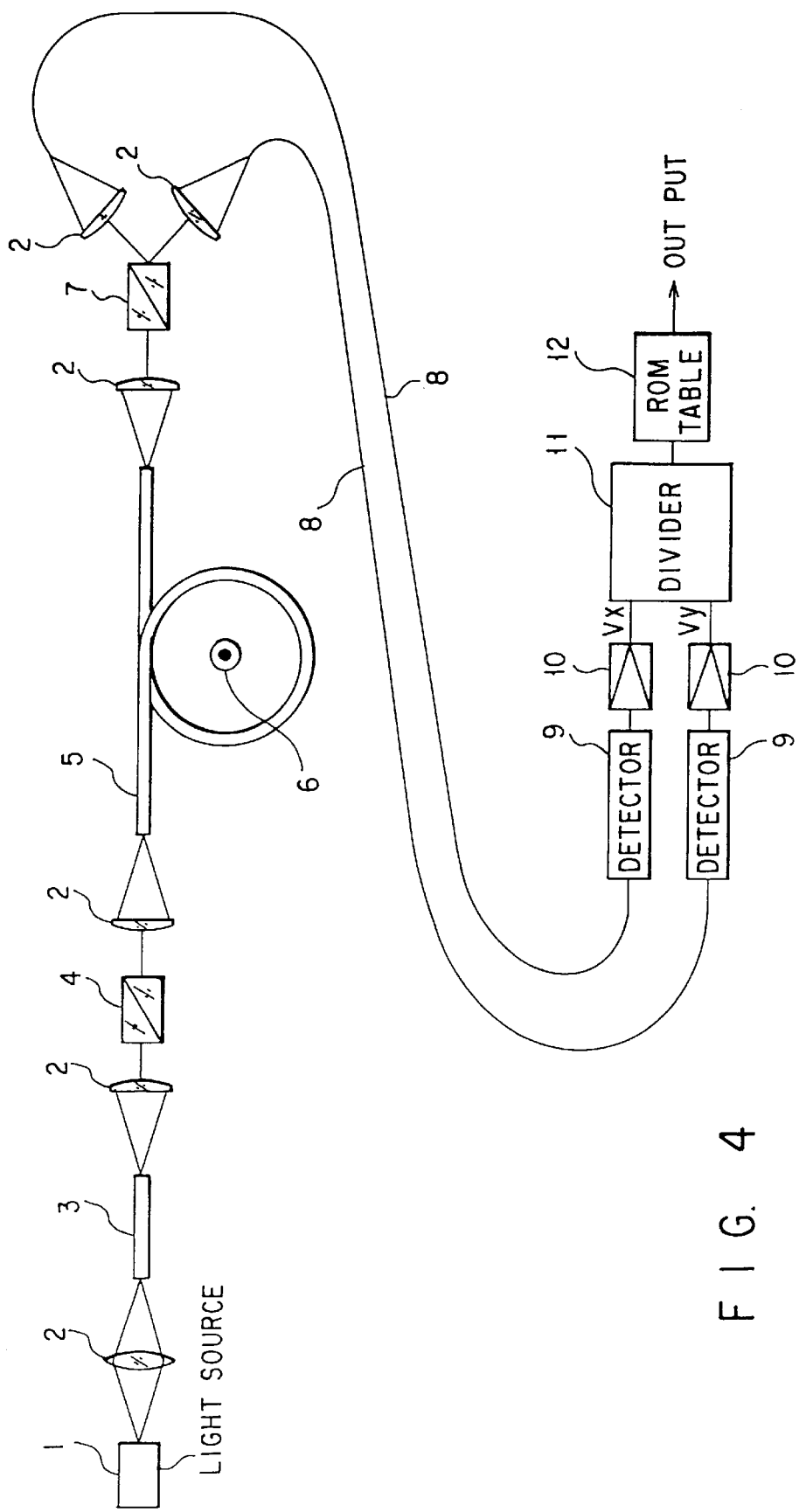
FIG. 4 is a view showing the arrangement of an optical current measuring device according to the present invention.

Prior to a description of the embodiments, the principle of an optical current measuring device according to the present invention will be described first. As shown in FIG. 4, light from a light source 1 constituted by a laser diode or a light-emitting diode is brought to a focus by a lens 2 to be incident on a transmission fiber 3. The light propagating through the transmission fiber 3 is converted into a parallel beam by a lens 2. The parallel beam passes through a polarizer 4 to be converted into linearly polarized light. This light is brought to a focus by a lens 2 to be incident on a sensor fiber 5. The sensor fiber 5 is wound around a conductor 6 through which a current to be measured flows. The light is subjected to Faraday rotation in proportion to the magnetic field generated by the current flowing through the conductor 6 while propagating through the sensor fiber 5. The resultant linearly polarized light is rotated through an angle θ and output. By measuring this rotational angle θ, therefore, the current value can be obtained.

As a method of measuring this rotational angle θ, a detection method of splitting the above light into two polarized light components by using an analyzer 7 constituted by a Wollaston prism rotated 45° with respect to the polarizer 4 in FIG. 4 is used. More specifically, the light emerging from the sensor fiber 5 is converted into a parallel beam again by a lens 2 and split into two light components $\underline{x}$ and $\underline{y}$ by the analyzer 7 constituted by the Wollaston prism. These two light components are respectively incident on two reception fibers 8 through different lenses 2. The two light components $\underline{x}$ and $\underline{y}$ propagating through the reception fibers 8 are respectively guided to two detectors 9.

The two light signals based on the light components $\underline{x}$ and $\underline{y}$ are respectively converted into electrical signals Vx and Vy by the two detectors 9. In this case, the electrical signals Vx and Vy are expressed by the following equations:

$$Vx = b \cdot \sin^2(45° + \theta) = b/2(1 + \sin 2\theta)$$

$$Vy = b \cdot \cos^2(45° + \theta) = b/2(1 - \sin 2\theta)$$

where $\underline{b}$ is a proportional coefficient.

The electrical signals Vx and Vy obtained by the detectors 9 in this manner are further sent to two AGC amplifiers 10 to be normalized with the DC components according to the following equations:

$$Vx' = Vx / \int_0^{2\pi} Vx \cdot \omega t = \frac{b/2(1 + \sin 2\theta)}{b/2}$$

$$= 1 + \sin 2\theta$$

$$Vy' = Vy / \int_0^{2\pi} Vy \cdot \omega t = 1 - \sin 2\theta$$

These electrical signals Vx' and Vy' are processed by a divider 11 and a ROM table 12, and a current value I is obtained by calculating the arcsine of the division of the sum and the difference according to the following equation:

$$\sin^{-1} \frac{Vx' - Vy'}{Vx' + Vy'} = \sin^{-1} \frac{2 \sin 2\theta}{2} = 2\theta \propto I$$

In the above optical current measuring device, the current signal output has no dependence on the light signal intensity. For this reason, the device can perform high-precision current measurement without causing any error due to, for example, a change in light amount which is caused when a misalignment or a deterioration in light source occurs. Such an optical current measuring device has excellent insulating properties and a compact structure. For this reason, it is expected that the device will have higher performance, serving as a current measuring device especially for high-voltage equipment in a power system.

The preferred embodiments of the optical current measuring device of the present invention will be described in detail below with reference to the accompanying drawings.

(First Embodiment)

Figure 2:
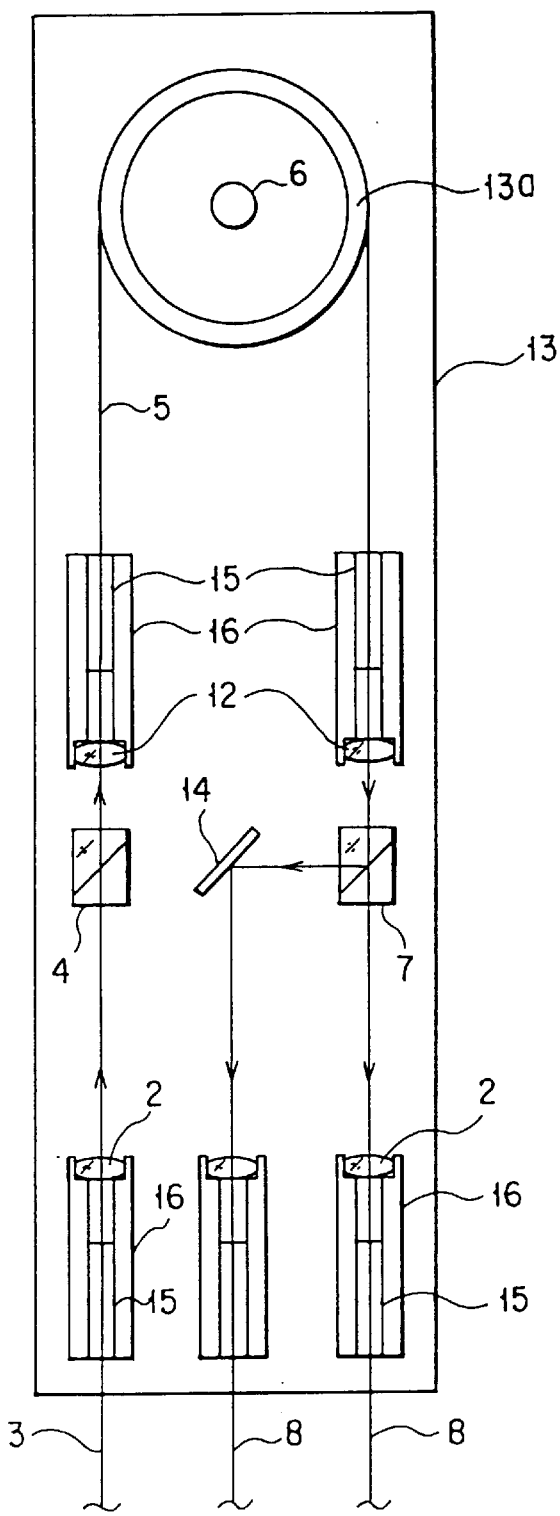
FIG. 2 is a plan view showing the detailed arrangement of an optical system used for an optical current measuring device.
Figure 3:
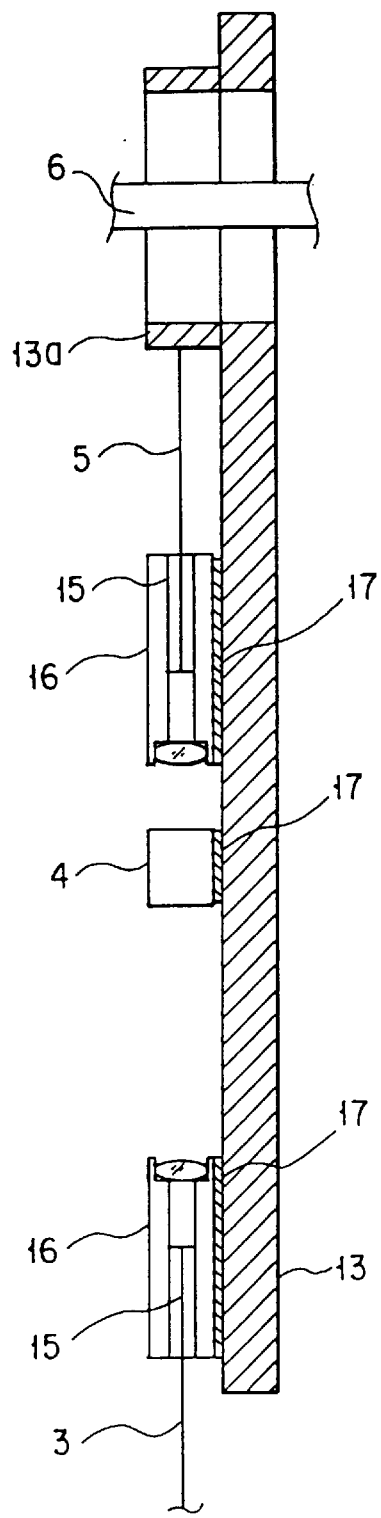
FIG. 3 is sectional view of FIG. 2.
Figure 5:
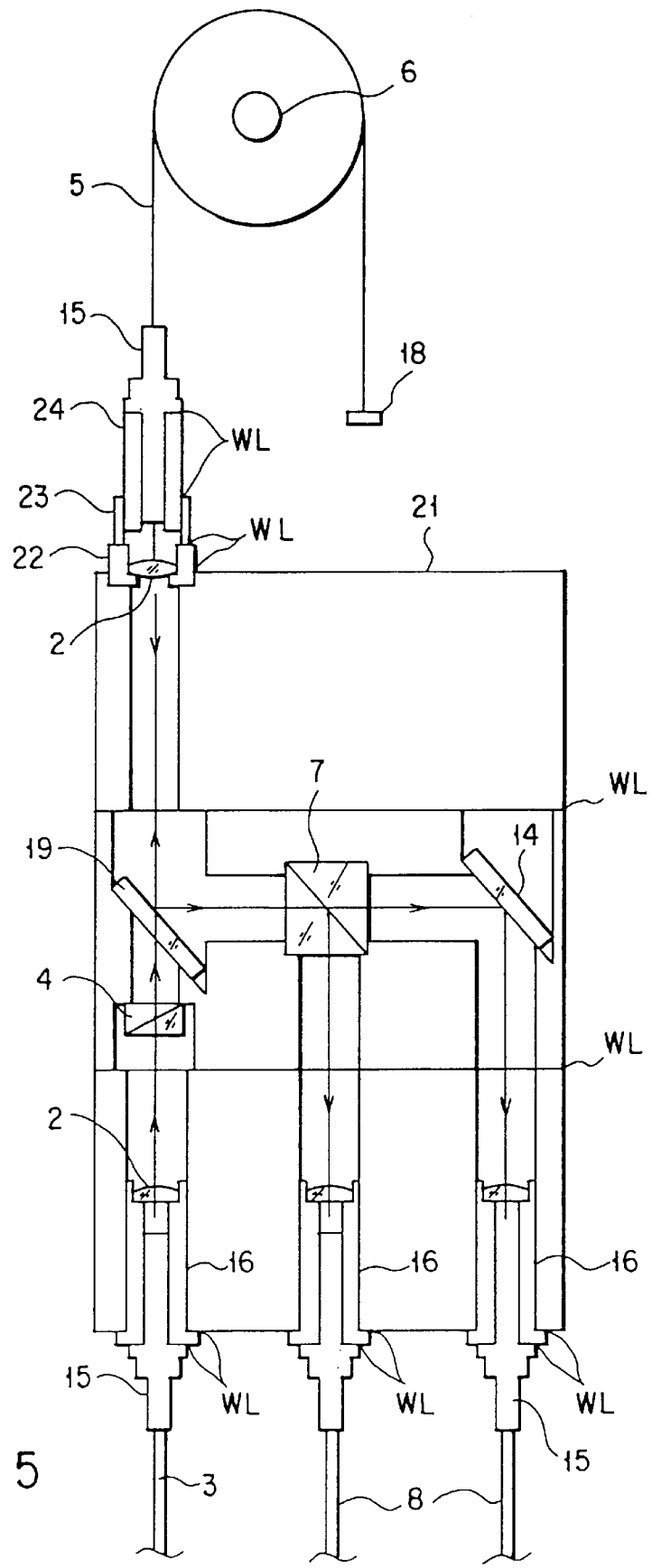
FIG. 5 is a view showing the arrangement of an optical system according to the first embodiment of the present invention.

FIG. 5 is a view showing the arrangement of an optical current measuring device according to the first embodiment of the present invention. This embodiment is associated with the optical system to which conceptions 1 to 8 are applied. In the prior art shown in FIGS. 2 and 3, the optical system is based on the scheme in which light travels through the sensor fiber only one way. In this embodiment, however, the optical system is based on a scheme in which light travels through the sensor fiber two ways. The use of such different schemes is simply a matter of selection in design, but is not essentially associated with the present invention, and hence a description thereof will be omitted.

As shown in FIG. 5, a plurality of optical parts constituting an optical system ranging from a transmission fiber 3 to two reception fibers 8 are housed in an optical system housing box 21 except for the optical fiber portions. These parts are fixed to the optical system housing box 21 by laser welding. Reference symbol WL in FIG. 5 denotes such a laser welded portion. The arrangement of the respective portions will be sequentially described below.

The optical system housing box 21 is formed by joining three blocks, each made of nickel alloy steel containing 30 to 40% of nickel, to each other by laser welding. These three blocks are bored in accordance with the optical parts to be fixed.

A collimator including a fiber connector 15 attached to one end portion of a sensor fiber 5 and a lens 2 coupled thereto is fixed to an end portion of one block in the block stacking direction of the optical system housing box 21 by laser welding (laser welded portion WL). The collimator for this sensor fiber 5 is assembled by using a lens holder 22, an adjustment sleeve 23, and a connector holder 24 instead of a single mount member 16.

Figure 6A:
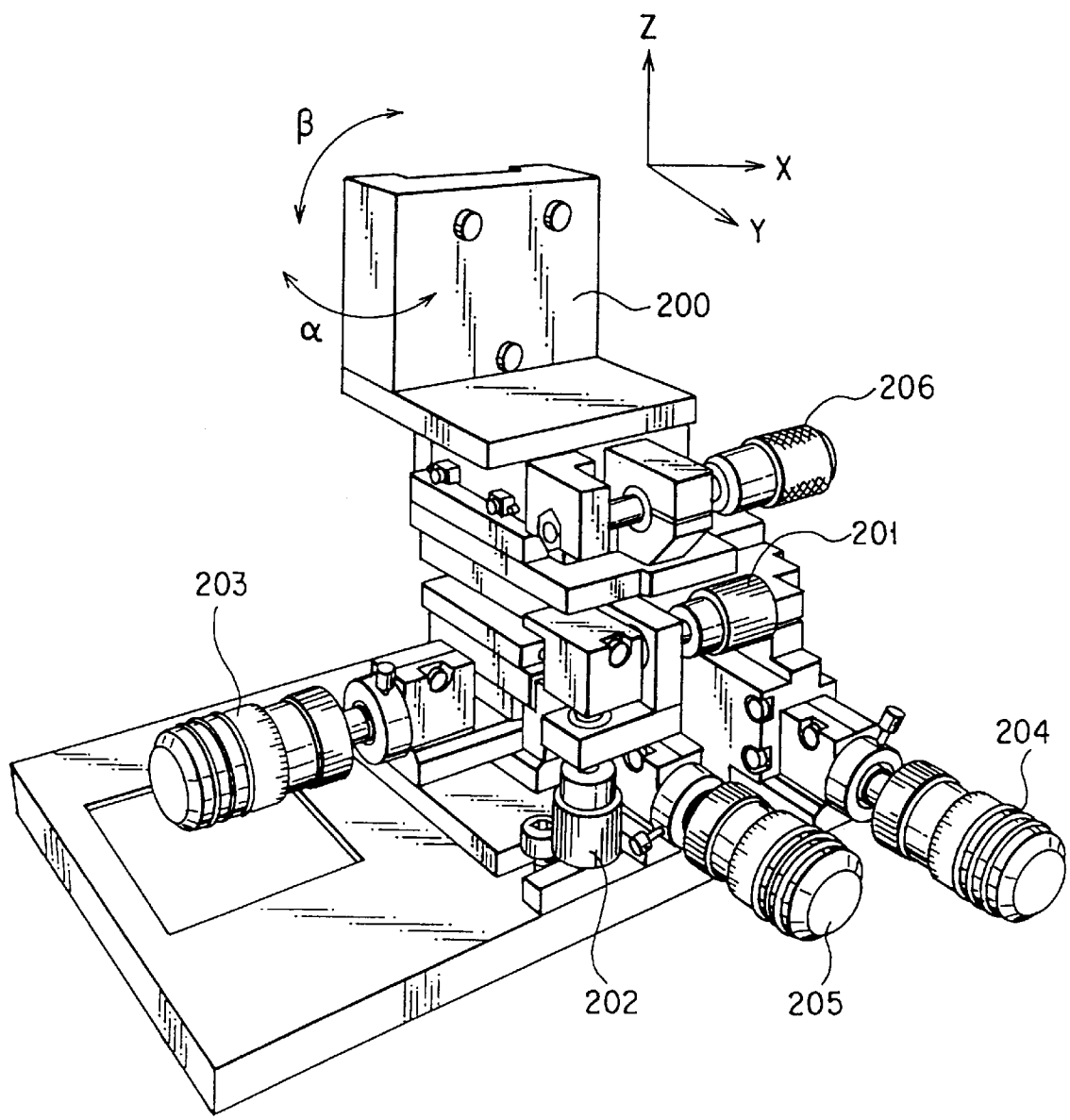

In this case, the lens holder 22 is a fixing member to which the lens 2 is attached. The connector holder 24 is a fixing member for holding the fiber connector 15. The adjustment sleeve 23 is a fixing member disposed between the lens holder 22 and the connector holder 24 to attain alignment between the lens 2 and the fiber connector 15. That is, in assembling this collimator, alignment in the optical axis direction is performed by sliding the adjustment sleeve 23 and the connector holder 24. In order to make the optical axes of the lens 2 and the sensor fiber 5 coincide with each other, alignment is performed by sliding the lens holder 22 and the adjustment sleeve 23 in a direction perpendicular to the optical axis. For example, these aligning operations are performed with the jig shown in FIGS. 6A and 6B. When positioning is completed, the respective members are fixed by laser welding. The jig shown in FIGS. 6A and 6B includes a mount portion 200, rotating knobs 201 and 202 for rotating the mount portion 200 in the α and β directions, and knobs 203, 204, and 205 for finely moving the mount portion 200 in the X, Y, and Z directions. Since the optical system housing box 21 is fixed at three positions on the mount portion 200 in the X direction, the optical system housing box 21 needs to be coarsely moved (moved by a long distance) in the X direction. For this reason, the jig includes a knob 206 for coarse movement (long-distance movement) in the X direction.

The lens holder 22, the adjustment sleeve 23, the connector holder 24, and the fiber connector 15 each consist of the same nickel alloy steel containing 30 to 40% of nickel as that used for the optical system housing box 21 described above. The lens holder 22 is fixed to the optical system housing box 21 by laser welding (laser welded portion WL). The lens holder 22, the adjustment sleeve 23, the connector holder 24, and the fiber connector 15 are fixed to each other by laser welding (laser welded portions WL). Note that a reflecting mirror 18 for reflecting in-coming light having propagated through the sensor fiber 5 to cause it to propagate as returning light in the opposite direction is attached to the other end portion of the sensor fiber 5.

A beam splitter 19, a polarizer 4, a lens 2, and a collimator for the transmission fiber 3 are disposed in a row on the extended line of the collimator for the sensor fiber 5.

Of these components, the beam splitter 19 transmits part of linearly polarized light from the polarizer 4 to guide it to the sensor fiber 5, and reflects part of light emerging from the sensor fiber 5 in the 90° direction. The beam splitter 19 and the polarizer 4 are incorporated in the block in the middle of the optical system housing box 21.

The collimator for the transmission fiber 3, which includes the fiber connector 15 and the lens 2 coupled thereto, is fixed to an end portion of the block on the opposite side of the optical system housing box 21 to the sensor fiber 5 by laser welding (laser welded portion WL). This collimator for the transmission fiber 3 is assembled by using a single mount member (fixing member) 16, unlike the collimator for the sensor fiber 5.

This mount member 16 of the collimator and the fiber connector 15 each consist of the same nickel alloy steel containing 30 to 40% of nickel as that used for the optical system housing box 21 described above. The mount member 16 is fixed to the optical system housing box 21 by laser welding (laser welded portion WL). The mount member 16 and the fiber connector 15 are fixed to each other by laser welding (laser welded portion WL).

An analyzer 7 and the deflecting mirror 14 are disposed in a row on the optical path of light reflected by the beam splitter 19. In addition, the first reception fiber 8 is placed on the optical path of light emerging from the analyzer 7 in the 90° direction and the second reception fiber 8 is placed on the optical path of light deflected by the deflecting mirror 14.

Similar to the beam splitter 19 and the polarizer 4 described above, the analyzer 7 and the deflecting mirror 14 are incorporated in the block in the middle of the optical system housing box 21.

The collimators for the two reception fibers 8 are disposed to be parallel to the collimator for the transmission fiber 3. Similar to the collimator for the transmission fiber 3, each of the collimators for the two reception fibers 8 is assembled from a fiber connector 15, a lens 2, and a mount member (fixing member) 16, and is fixed to the optical system housing box 21 by laser welding (laser welded portion WL).

The mount member 16 and the fiber connector 15 of each of the collimators for the two reception fibers 8 each consist of the same nickel alloy steel containing 30 to 40% of nickel as that used for the optical system housing box 21. The mount member 16 is fixed to the optical system housing box 21 by laser welding (laser welded portion WL), and the mount member 16. and the fiber connector 15 are fixed to each other by laser welding (laser welded portion WL).

The optical system according to the first embodiment, which has the above arrangement, operates as follows. First of all, light emitted from a light source (not shown) is guided by the transmission fiber 3 and converted into a parallel beam by the collimator at the exit end portion of the transmission fiber 3. The parallel beam reaches the polarizer 4. In this case, as described above, since the polarizer 4 is placed such that its polarization azimuth makes 45° with the horizontal or vertical direction, the light is converted into linearly polarized light polarized at an azimuth angle of 45°. This light enters the beam splitter 19. Part of the light passes through the beam splitter 19 first, and is then converted into a focused light beam by the collimator at the end portion of the sensor fiber 5. This light beam is incident on one end of the sensor fiber 5.

The light entering one end of the sensor fiber 5 propagates through the sensor fiber 5 and is reflected by the reflecting mirror 18 on the other end to return to the collimator. While making a two-way trip in the sensor fiber 5 in this manner, this light is subjected to Faraday rotation owing to a magnetic field generated by a current (to be measured) flowing through the conductor 6. As a result, the azimuth of the light changes. Thereafter, the light is converted into a parallel beam by the collimator at the end portion of the sensor fiber 5 and returns to the beam splitter 19. Part of the light having returned to the beam splitter 19 is reflected to be incident on the analyzer 7. The light is split into a linearly polarized light beam (x component) polarized in the horizontal direction and a linearly polarized light beam (y component) polarized in the vertical direction by the analyzer 7. One of the light beams split in this manner is directly incident on the collimator at the incident end portion of one of the two reception fibers 8, while the other light beam is incident on the collimator at the incident end portion of the other reception fiber 8 through the deflecting mirror 14. The light beams are then converted into focused light beams and incident on the respective reception fibers 8.

Figure 1:
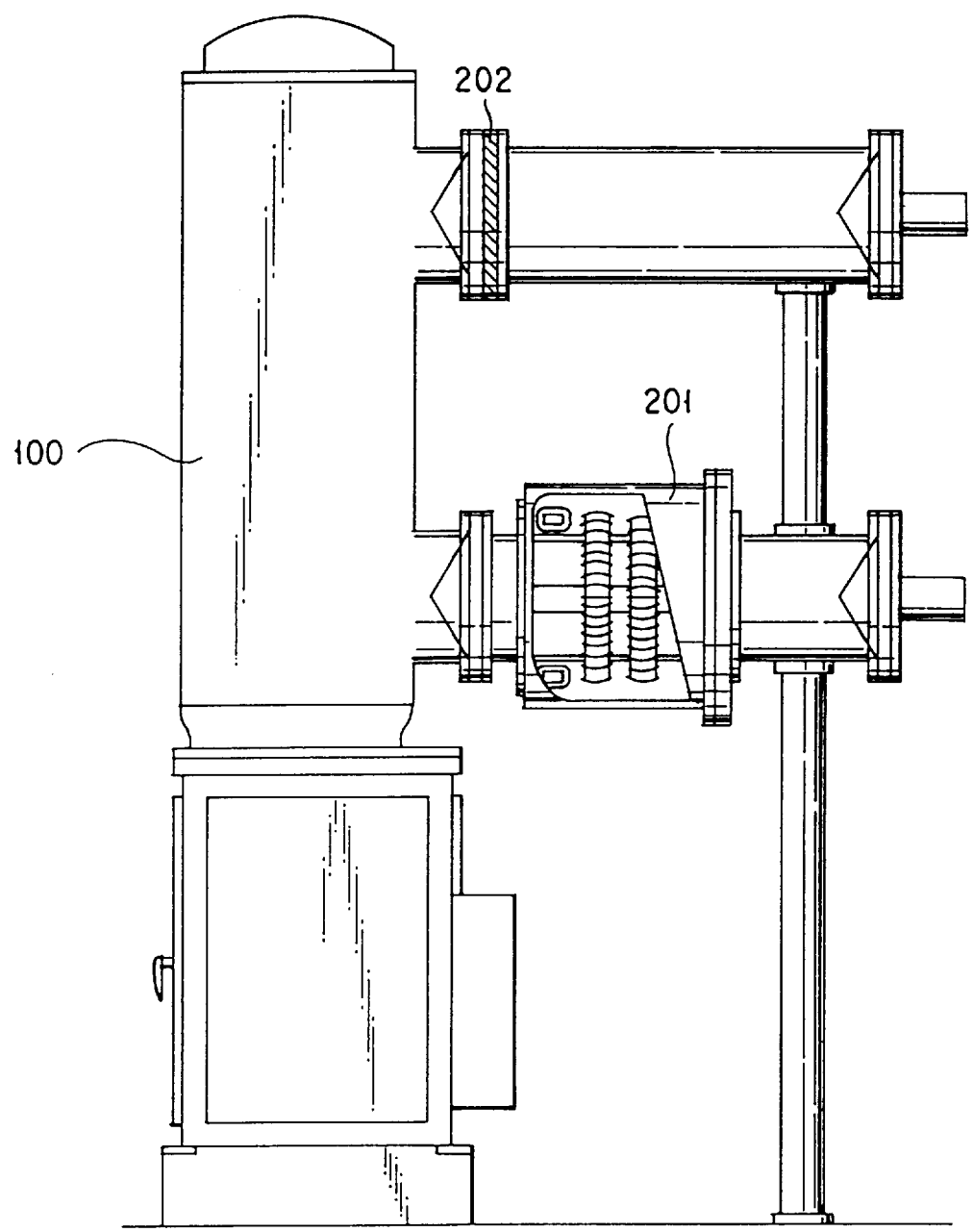
FIG. 1 is a view showing a current transformer and an optical current measuring device which are applied to a gas circuit breaker.

The light beams incident on the reception fibers 8 in this manner are processed by a signal processing means including detectors and the like, as in the conventional optical current measuring device described with reference to FIG. 1, by the same procedure as that in the prior art.

As described above, in this embodiment, the fixing members such as the fiber connectors 15, the mount members 16, the lens holder 22, the adjustment sleeve 23, and the connector holder 24 and the optical system housing box 21 each consist of nickel alloy steel containing no phosphorus. Since the fixing members and the optical system housing box are manufactured by using an alloy containing no phosphorus, and assembled by laser welding, highly reliable fixing portions can be formed without mixing any foreign materials or causing any cracks. The optical parts can therefore be fixed firmly and stably. As a result, there is no possibility of positional shifts and detachment of the respective optical parts, and the high-precision optical system can be maintained in a stable state for a long period of time.

In addition, since laser welding is a noncontact process, the optical parts can be assembled without applying any force. For this reason, there is no possibility that laser welding affects the optical characteristics of the optical parts. Furthermore, since laser welding is a welding method with a small heat gain, the thermal strain on the overall optical system can be reduced to a practically negligible degree.

Since the optical system housing box 21, which houses the optical parts other than the optical fibers such as the transmission fiber 3, the sensor fiber 5, and the reception fibers 8, is made of nickel alloy steel as a magnetic metal, the optical parts housed in the box 21 can be shielded from external magnetic fields so as to prevent the optical parts other than the sensor fiber from being subjected to undesired Faraday rotation. As a result, errors due to external magnetic fields and influences of noise can be reduced. In addition, since the optical parts other than the optical fibers are housed in the optical system housing box 21, the optical system housing box 21 can be reduced in size and simplified as compared with the housing box in the prior art shown in FIGS. 2 and 3, in which the sensor fiber 5 is mounted.

The nickel alloy steel containing 30 to 40% nickel, used in this embodiment, has a very low coefficient of thermal expansion, about 1/10 that of other metals. By using the nickel alloy steel having such a low coefficient of thermal expansion as a material for the fixing members and the optical system housing box, the high temperature stability of the overall optical system can be maintained.

In the first embodiment, as the material for the fixing members and the optical system housing box, the nickel alloy steel containing 30 to 40% of nickel is used. However, nickel alloy steel with a different nickel content may be used. In addition, a magnetic metal other than the above nickel alloy steels or a metal containing no phosphorus may be used. In this case as well, excellent effects can be obtained although the effects vary more or less depending on the materials used.

Furthermore, if a metal containing no phosphorus is used for at least the fixing portions between the fixing members and the optical system housing box, certain effects can be obtained. The optical system housing box need not be made of a magnetic metal. Such a box is inferior to the above optical system housing box in terms of the effect of shielding the optical part from eternal magnetic fields. However, satisfactory effects similar to those described above can be obtained by fixing the optical parts to the box by laser welding.

In the first embodiment, the optical system housing box is formed by welding the three blocks to each other. In practice, however, the arrangement of the optical system housing box can be arbitrarily changed. For example, this box may be formed by welding two blocks to each other or welding four or more blocks to each other. Alternatively, the box may be formed by boring a single block. In addition, the optical system housing box may be constituted by plate-like members or a combination of plate-like members and blocks.

(Second Embodiment)

Figure 7:
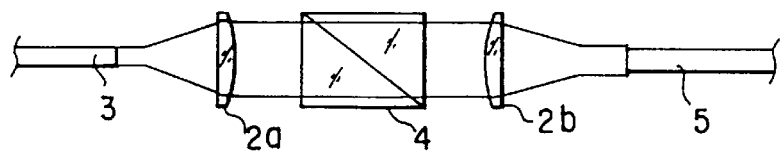
FIG. 7 is a view showing the arrangement of the coupling portion between a transmission fiber and a sensor fiber according to the second embodiment of the present invention.

FIG. 7 shows an optical current measuring device according to the second embodiment of the present invention, and more specifically, the arrangement of the coupling portion between a transmission fiber and a sensor fiber, to which conception 9 is applied. As shown in FIG. 7, a first lens 2a, a polarizer 4, and a second lens 2b are disposed in a row at the coupling portion between the exit end portion of a transmission fiber 3 and the incident end portion of a sensor fiber 5. In this arrangement, light emerging from the transmission fiber 3 is converted into a parallel beam by the first lens 2a and incident on the polarizer 4. The light is linearly polarized by the polarizer 4. The linearly polarized light is brought to a focus by the second lens 2b to enter the sensor fiber 5. The transmission fiber 3 and the sensor fiber 5 are single-mode optical fibers having the same core diameter.

In this embodiment, in particular, the first and second lenses 2a and 2b are selected as follows. The first and second lenses 2a and 2b are selected such that focal lengths fa and fb of the first and second lenses 2a and 2b satisfy $fb \geq 2^{1/2} fa$. The exit end face of the transmission fiber 3 and the incident end face of the sensor fiber 5 are placed at the focal positions of the lenses 2a and 2b. The spot size of the light beam on the incident end face of the sensor fiber 5 is set to be fb/fa times, i.e., $2^{1/2}$ times or more, the core diameter of the transmission fiber 3 on the basis of the relationship between the focal lengths fa and fb of the lenses 2a and 2b and the positions of the fibers 3 and 5. In this case, since the core diameter of the transmission fiber 3 is equal to that of the sensor fiber 5, the spot size of the beam on the incident end face of the sensor fiber 5 is set to be $2^{1/2}$ or more the core diameter of the sensor fiber 5.

In the second embodiment having the above arrangement, the following effects can be obtained. Assume that the transmission fiber 3 and the sensor fiber 5 are single-mode optical fibers having the same core diameter. In this case, when fa=fb, the coupling efficiency between the transmission fiber 3 and the sensor fiber 5 is maximized. When misalignment occurs due to vibrations or changes in temperature, the coupling efficiency drops abruptly. In contrast to this, in this embodiment, the spot size of the light beam on the incident end face of the sensor fiber 5 is set to be $2^{1/2}$ times or more the core diameter of the sensor fiber 5. The difference between the core diameter and the spot size provides a margin for misalignment, and hence reduces the change in light amount due to misalignment, thereby improving the stability of the light amount. In this embodiment, in particular, since the spot size is set to be larger than the core size, a large margin can be set for misalignment.

In this embodiment, therefore, the stability of the amount of light incident on the sensor fiber 5 can be improved, and the precision of the optical system can be improved by setting the spot size of the incident light beam to be larger than the core diameter of the sensor fiber 5. Consequently, the measurement precision of the optical measuring device can be improved.

In practice, the method of setting the spot size of the light beam on the incident end face of the sensor fiber 5 to be larger than the core size of the sensor fiber 5 is not limited to the method using lenses having different focal lengths, as in this embodiment. That is, a modification of the second embodiment uses lenses having the same focal length. The incident end face of the sensor fiber 5 is placed at a position slightly shifted from the focal position of the second lens 2b. With this arrangement, similar to the second embodiment, the spot size of the light beam on the incident end face of the sensor fiber 5 can be set to be large, and hence the same effects as described above can be obtained.

In the second embodiment, conception 9 is applied to the collimator at the incident end portion of the sensor fiber. However, conception 9 can be applied to the collimator at the incident end portion of the reception fiber. In this case, similar to the second embodiment, the change in light amount upon occurrence of misalignment can be reduced.

(Third Embodiment)

Figure 8:
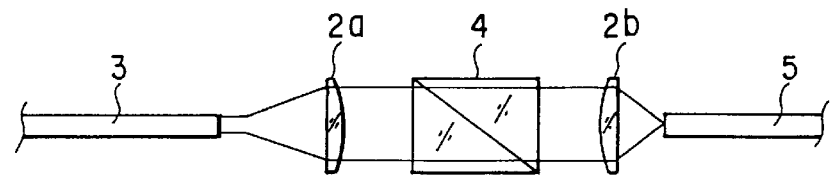
FIG. 8 is a view showing the arrangement of the coupling portion between a transmission fiber and a sensor fiber according to the third embodiment of the present invention.

FIG. 8 shows an optical measuring device according to the third embodiment of the present invention, and more specifically, the arrangement of the coupling portion between a transmission fiber and a sensor fiber, to which conception 10 is applied. As shown in FIG. 8, the basic arrangement of this embodiment is the same as that of the second embodiment. That is, a first lens 2a, a polarizer 4, and a second lens 2b are disposed in a row at the coupling portion between the exit end portion of a transmission fiber 3 and the incident end portion of a sensor fiber 5. In this arrangement, light emerging from the transmission fiber 3 is converted into a parallel beam by the first lens 2a and incident on the polarizer 4. The light is linearly polarized by the polarizer 4. The linearly polarized light is then brought to a focus by the second lens 2b and enters the sensor fiber 5. The transmission fiber 3 and the sensor fiber 5 are single-mode optical fibers having the same core diameter.

In this embodiment, in particular, the first and second lenses 2a and 2b are selected as follows. In contrast to the second embodiment, the first and second lenses 2a and 2b are selected such that focal lengths fa and fb of the first and second lenses satisfy fb≧$2^{1/2}$fa. The exit end face of the transmission fiber 3 and the incident end face of the sensor fiber 5 are placed at the focal positions of these lenses 2a and 2b. The spot size of the light beam on the incident end face of the sensor fiber 5 is set to be fb/fa, i.e., $2^{-1/2}$ times or less, the core diameter of the transmission fiber 3 on the basis of the relationship between the focal lengths fa and fb of the lenses 2a and 2b and the positions of the fibers 3 and 5. In this case, as described above, since the core diameter of the transmission fiber 3 is equal to that of the sensor fiber 5, the spot size of the light beam on the incident end face of the sensor fiber 5 is set to be $2^{-1/2}$ times or less the core diameter of the sensor fiber 5.

In the third embodiment having the above arrangement, the spot size of the light beam on the incident end face of the sensor fiber 5 is set to be as small as $2^{-1/2}$ or less the core diameter of the sensor fiber 5. The difference between the core diameter and the spot size provides a margin for misalignment. In this case, light is incident on the sensor fiber 5 at an NA larger than that of the sensor fiber 5, resulting in a loss. However, no change in light amount occurs if the misalignment falls within the range of the core diameter.

As described above, in this embodiment, since the spot size is set to be smaller than the core diameter, the margin for misalignment cannot be set to be as large as that in the second embodiment. However, the light amount undergoes no change upon occurrence of misalignment. That is, even if misalignment occurs, the entire beam can be sent to the core of the sensor fiber 5. For this reason, the light amount undergoes no change. This embodiment can therefore be effectively applied to a device which is easily affected by changes in light amount.

According to this embodiment, therefore, by setting the spot size of the incident light beam to be smaller than the core diameter of the sensor fiber 5, the stability of the amount of light incident on the sensor fiber 5 can be improved, and the precision of the optical system can be improved. Consequently, the measurement precision of the optical measuring device can be improved.

In the third embodiment, conception 10 is applied to the collimator at the incident end portion of the sensor fiber. However, conception 10 can be equally applied to the collimator at the incident end portion of a reception fiber. In this case, similar to the third embodiment, changes in light amount upon occurrence of misalignment can be prevented.

(Fourth Embodiment)

Figure 9:
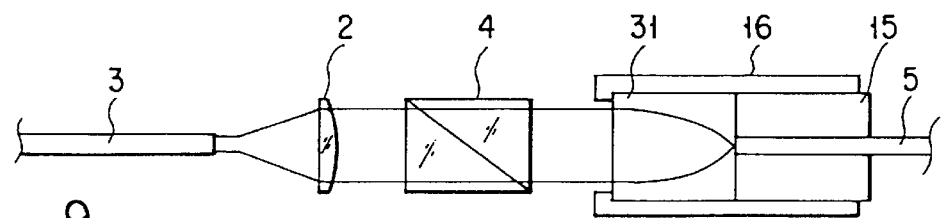
FIG. 9 is a view showing the arrangement of the coupling portion between a transmission fiber and a sensor fiber according to the fourth embodiment of the present invention.

FIG. 9 shows an optical measuring device according to the fourth embodiment of the present invention, and more specifically, the arrangement of the coupling portion between a transmission fiber and a sensor fiber, to which conceptions 11 to 13 are applied. As shown in FIG. 9, in the fourth embodiment, a lens 2 similar to the lens 2a in the second and third embodiments is placed as a lens for forming light emerging from a transmission fiber 3 into a parallel beam and causing it to be incident on a polarizer 4. A distributed index lens (GRIN lens) 31 is placed as a lens for focusing light linearly polarized by the polarizer 4 to guide it to a sensor fiber 5.

The GRIN lens 31 is designed to have a focal position coinciding with the lens end face and a diameter equal to the diameter of a fiber connector 15 placed on the incident end portion of the sensor fiber 5. The GRIN lens 31 and the sensor fiber 5 are disposed such that the lens end face of the GRIN lens 31 opposes the fiber end face of the sensor fiber 5 in contact. In this case, the lens end face of the GRIN lens 31 is also in contact with the end face of the fiber connector 15. In this state, the GRIN lens 31 and the fiber connector 15 are mounted on a single mount member 16.

In the fourth embodiment having the above arrangement, since the GRIN lens 31 is used as a lens for focusing light to be incident on the sensor fiber 5, a high coaxiality can be obtained between the periphery of the lens and the optical axis of the lens. For this reason, the optical axis of the GRIN lens 31 can be accurately aligned with the optical axis of the sensor fiber 5 without using any optical axis adjustment mechanism, thereby improving the stability of the light amount. In this embodiment, in particular, the fiber connector 15 for supporting the end portion of the sensor fiber 5 has the same diameter as that of the GRIN lens 31. For this reason, when these components are mounted on the mount member 16, optical axis alignment can be easily performed.

In addition, since the GRIN lens 31 can be accurately designed such that the focal position coincides with the lens end face, the lens end face of the GRIN lens 31 and the fiber end face of the sensor fiber 5 can be positioned to oppose in contact with each other, as described above. By positioning these 15 components with their end faces opposing each other at the focal position in this manner, the GRIN lens 31 and the sensor fiber 5 can be set under the same vibration condition to suppress any deterioration in coupling efficiency due to vibrations, thereby improving the stability of the light amount.

In addition, reflectionless films must be formed on the end faces of optical parts such as lenses and optical fibers by vapor deposition or the like to reduce the reflectance. In this embodiment, however, since the lens end face of the GRIN lens 31 is in contact with the fiber end face of the sensor fiber 5, such reflectionless films need not be formed. Furthermore, on the fiber end face of the sensor fiber 5, the beam diameter is minimized, and changes in light amount tend to occur due to adhesion of foreign substances, e.g., dust, stains, and condensation. In this embodiment, however, since the lens end face of the GRIN lens 31 is in contact with the fiber end face of the sensor fiber 5, such foreign substances can be prevented from entering and adhering to the fiber end face. From the viewpoint of this advantage as well, the stability of the light amount can be improved.

According to this embodiment, since the GRIN lens 31 is used as a lens for sending light to the sensor fiber 5, and the lens end face is placed in contact with the fiber end face, the stability of the amount of light incident on the sensor fiber 5 can be improved as well as the precision of the optical system. Consequently, the measurement precision of the optical measuring device can be improved.

Figure 10:
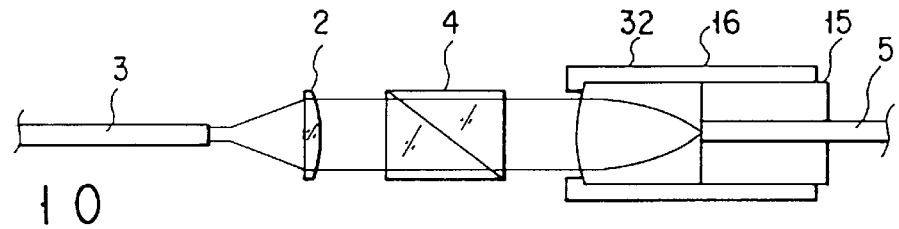
FIG. 10 is a view showing the arrangement of a modification of the coupling portion in FIG. 9.

In the fourth embodiment, the GRIN lens is used as a lens for sending light to the sensor fiber 5. However, a spherical lens may be used in place of the GRIN lens. FIG. 10 shows an arrangement using a spherical lens 32, which is designed to make the focal position coincide with the lens end face. With this arrangement as well, the same effects as those of the fourth embodiment can be obtained.

In the fourth embodiment, conceptions 11 to 13 are applied to the collimator at the incident end portion of the sensor fiber. However, conceptions 11 to 13 can also be applied to the collimator at the incident end face of a reception fiber. In this case, similar to the fourth embodiment, the stability of the light amount can be improved.

(Fifth Embodiment)

Figure 11:
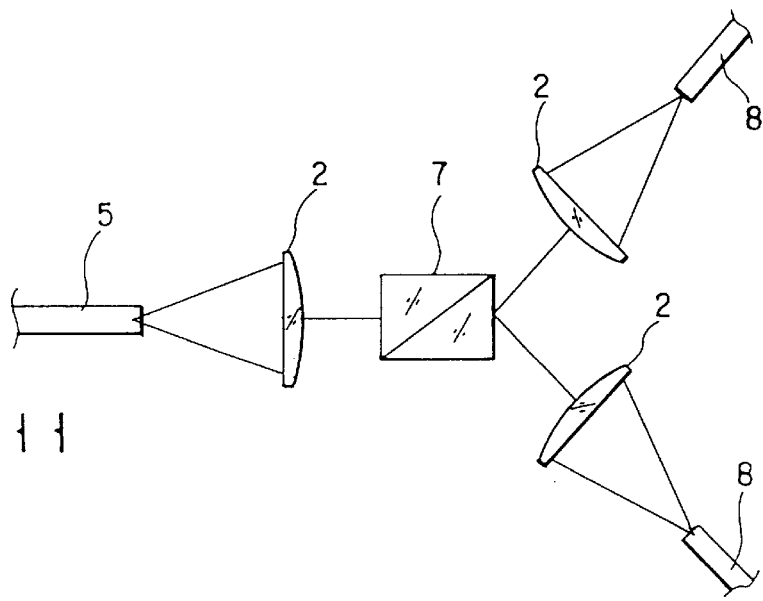
FIG. 11 is a view showing the arrangement of the coupling portion between a sensor fiber and two reception fibers according to the fifth embodiment of the present invention.

FIG. 11 shows an optical measuring device according to the fifth embodiment of the present invention, and more specifically, the arrangement of the coupling portion between a sensor fiber and two reception fibers. As shown in FIG. 11, the coupling portion between the exit end portion of a sensor fiber 5 and the incident end portions of two reception fibers is designed such that light emerging from the sensor fiber 5 is converted into a parallel beam by a lens 2 and arrives an analyzer 7 constituted by a Wollaston prism, the light is split into two light components $\underline{x}$ and $\underline{y}$ by the analyzer 7, and the two light components are respectively brought to a focus by two lenses 2 to be incident on two reception fibers 8. In this embodiment, in particular, a step-index multimode optical fiber having a core diameter of 100 µm or more and an NA of 0.25 or more is used as each reception fiber 8.

In the fifth embodiment having the above arrangement, the following effects can be obtained. When the loss at the coupling portion for each reception fiber 8 changes because of vibrations or the like, an error may be caused. In general, therefore, a multimode optical fiber is used as each reception fiber 8. However, a general distributed index (GI type) fiber has a core diameter as small as 50 µm, and the coupling efficiency varies depending on whether light comes to a focus on the central portion of the core or the peripheral portion of the core. For this reason, a light amount loss is caused by vibrations. In addition, the NA of such a distributed index (GI type) fiber is as low as about 0.2. For this reason, if an angle shift occurs between light from the lens and the fiber, the loss increases, resulting in an error.

In contrast to this, in this embodiment, since the multimode optical fibers each having a core diameter as large as 100 µm or more are used, changes in coupling efficiency due to misalignment can be suppressed. In addition, since each fiber has an NA of 0.25 or more, the light loss due to a bend in the optical fiber can be reduced.

According to this embodiment, since a multimode optical fiber having a large code diameter and a high NA is used as each reception fiber 8, the stability of the amount of light incident on the reception fiber 8 can be improved to reduce the light loss, and the precision of the optical system can be improved. Consequently, the measurement precision of the optical measuring device can be improved.

As an optical fiber used as each reception fiber 8, a multimode optical fiber made of a multi-component glass material may be used by applying conception 16. With this arrangement, a higher NA and a lower loss can be realized. Furthermore, a multimode optical fiber having a quartz core and a plastic cladding may be used. With this arrangement, a high transmittance and a high NA can be realized in the infrared region.

(Sixth Embodiment)

Figure 12:
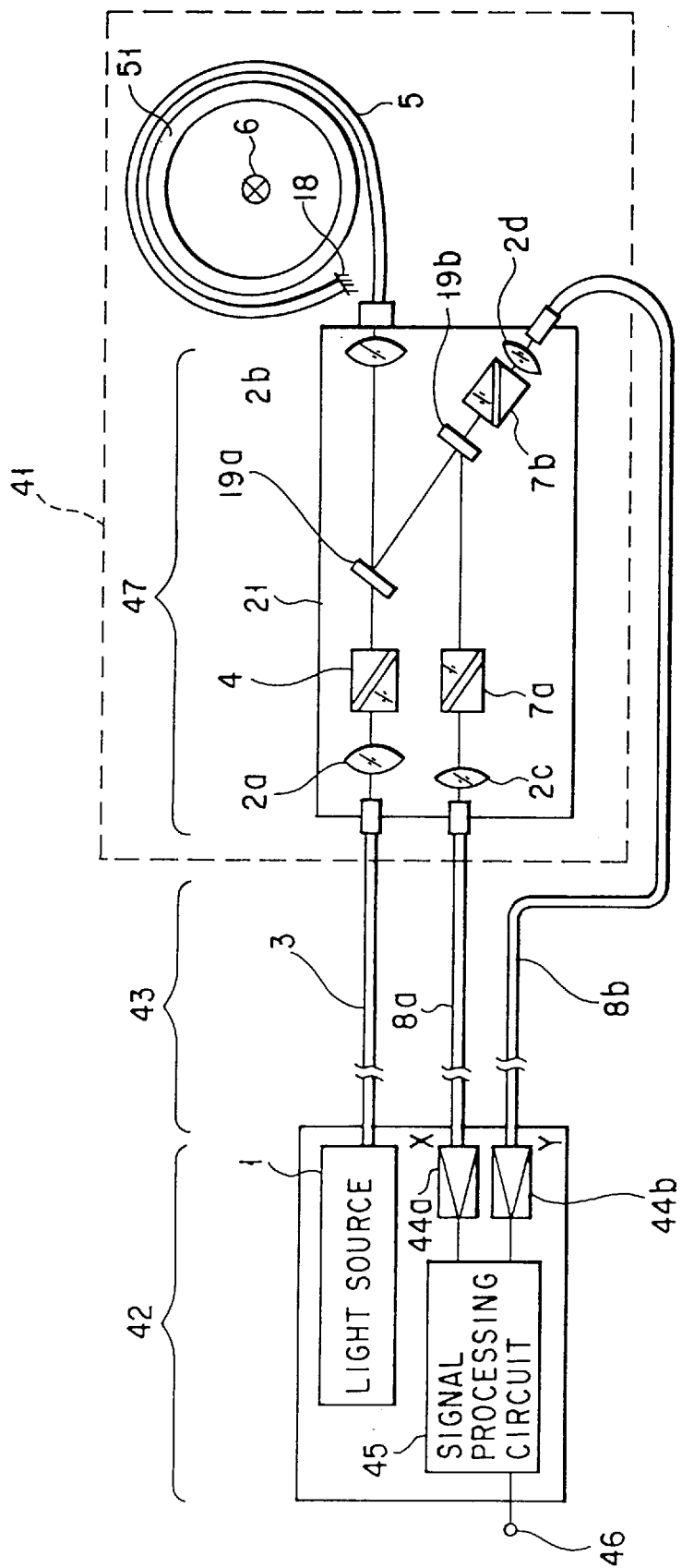
FIG. 12 is view showing the arrangement of an optical current measuring device according to the sixth embodiment of the present invention.

FIG. 12 shows an optical measuring device according to the sixth embodiment of the present invention, and more specifically, the arrangement of an optical current measuring device to which conceptions 18, 28, 29, and 32 are applied. In this embodiment, similar to the first embodiment, the present invention is applied to an optical system based on the scheme in which light travels through a sensor fiber two ways. As shown in FIG. 12, the optical current measuring device of this embodiment uses a sensor fiber (an optical fiber for a sensor) 5 as a sensor. This sensor fiber 5 is wound around an annular mount member 51 placed around a conductor 6 through which a current to be measured flows, and is partly fixed with the annular mount member 51. More specifically, the annular mount member 51 has a fixing portion (not shown) including a groove portion formed along the outer circumferential surface of the member and having a diameter larger than that of the sensor fiber 5, and a press portion for sealing the opening of the groove portion. The sensor fiber 5 is housed in the groove portion of the fixing portion with a margin, and is loosely fixed to the annular mount member 51. Note that a quartz fiber is used as the sensor fiber 5, and the fiber is twisted to become less susceptible to external conditions. In addition, the sensor fiber 5 is designed to set the decrease in current measurement sensitivity to 10% or less.

The optical measuring device of this embodiment having the above sensor fiber 5 is mainly constituted by a sensor optical section 41, a signal processing section 42, and a transmission fiber section 43, as shown in FIG. 12.

The signal processing section 42 includes a light source 1 for emitting measurement light, detectors 44a and 44b for detecting two light beams from the sensor optical section 41 and converting the light beams into electrical signals corresponding to the intensities of the light beams, a signal processing circuit 45 for processing the signals obtained by the detectors 44a and 44b, and an output terminal 46 for outputting the processing result. The signal processing section 42 having such an arrangement is placed at a sufficient distance (at least 10 m or more) from the sensor optical section 41.

The transmission fiber section 43 includes a transmission fiber 3 for sending light from the light source 1 in the signal processing section 42 to the sensor optical section 41, and two reception fibers 8a and 8b for sending light beams from the sensor optical section 41 to the two detectors 44a and 44b in the signal processing section 42. In this case, the light source 1 is constituted by a laser diode, a super-luminescent diode, or the like. The sensor optical section 41 includes the above sensor fiber 5 and a coupling optical system 47. The coupling optical system 47 includes a coupling optical box 21 and a plurality of optical parts housed in the coupling optical box 21, i.e., four lenses 2a to 2d, two beam splitters 19a and 19b, and two analyzers 7a and 7b.

In this case, the lenses 2a to 2d are used to convert light from the optical fiber into a parallel beam or focus parallel beams to send them to the optical fibers. The polarizer 4 is used to convert light from the lens 2a into a linearly polarized light polarized in the 45° direction with respect to the horizontal direction. The first beam splitter 19a is used to split light incident from the polarizer 4 onto the sensor fiber 5 and light emerging from the sensor fiber 5 into a transmitted light beam and a reflected light beam in accordance with the incident directions. The second beam splitter 19b is used to split a reflected light beam from the first beam splitter 19a into a transmitted light beam and a reflected light beam. The two analyzers 7a and 7b are used to extract orthogonal polarized light components $\underline{x}$ and $\underline{y}$ by transmitting light beams from the second beam splitter 19b which are polarized in the horizontal and vertical directions.

That is, the coupling optical system 47 is designed to guide light from the transmission fiber 3 to the leading end portion of the sensor fiber 5 through the first lens 2a, the polarizer 4, the first beam splitter 19a, and the second lens 2b. In addition, light emerging from the sensor fiber 5 is transmitted through the second lens 2b, reflected by the first beam splitter 19a to be sent to the second beam splitter 19b, and split into light beams in two directions. One split light beam is sent to one reception fiber 8a through the first analyzer 7a and the third lens 2c, and the other light beam is sent to the other reception fiber 8b through the second analyzer 7b and the fourth lens 2d.

A reflecting mirror 18 is placed on the trailing end portion of the sensor fiber 5 on the opposite side to the leading end portion. The reflecting mirror 18 reflects light propagating through the sensor fiber 5 to return it into the sensor fiber 5, thus causing it to travel in the opposite direction.

The current (to be measured) flowing through the conductor 6 is measured in the sixth embodiment having the above arrangement as follows.

First of all, light emitted from the light source 1 of the signal processing section 42 is sent to the coupling optical system 47 of the sensor optical section 41 through the transmission fiber 3. The light from the transmission fiber 3 is converted into a parallel beam by the first lens 2a and linearly polarized by the polarizer 4. Thereafter, the light is transmitted through the first beam splitter 19a and brought to a focus by the second lens 2b to enter the leading end portion of the sensor fiber 5.

The light incident on the sensor fiber 5 propagates through the sensor fiber 5 and is reflected by the reflecting mirror 18 on the trailing end portion of the sensor fiber 5. The reflected light returns to the sensor fiber 5 to propagate in the opposite direction and emerges from the leading end portion toward the coupling optical system 47 side. In this case, the plane of polarization of the light that travels through the sensor fiber 5 two ways is rotated owing to the Faraday effect ascribed to the current flowing through the conductor 6.

The light emerging from the sensor fiber 5 is converted into a parallel light beam by the second lens 2b of the coupling optical system 47. This parallel light beam is reflected by the first beam splitter 19a and split into light beams in two directions by the second beam splitter 19b. One split light beam is sent to the first analyzer 7a. The first analyzer 7a extracts the light component polarized in the $\underline{x}$ direction from the light. The resultant light is sent to one detector 44a of the signal processing section 42 through the third lens 2c and the reception fiber 8a. The other split light beam is sent to the second analyzer 7b. The second analyzer 7b extracts the light component polarized in the $\underline{y}$ direction. The resultant light is sent to the other detector 44b of the signal processing section 42 through the fourth lens 2d and the reception fiber 8b.

The respective light signals representing the light components polarized in the $\underline{x}$ and $\underline{y}$ directions and sent to the detectors 44a and 44b are converted into electrical signals by the detectors 44a and 44b. These electrical signals are amplified. The electrical signals are then sent to the signal processing circuit 45 to be processed. The obtained processing result, i.e., the measurement result, is output from the output terminal 46. Since this signal processing can be performed in the same manner as in the prior art, a description thereof will be omitted.

As described above, in this embodiment, the sensor fiber 5 is used as a sensor, and this sensor fiber is loosely fixed to the annular mount member 51. For this reason, no large stress is produced unlike the prior art, in which the sensor fiber is firmly fixed. Therefore, increases in birefringence amount due to such a stress can be suppressed, and an improvement in measurement precision can be attained. In addition, since the sensor fiber 5 can be mounted in a space around the conductor 6, the overall device can be reduced in size and simplified. That is, this embodiment is also advantageous in terms of cost.

In this embodiment, since the decrease in current measurement sensitivity that is determined by the sum of birefringence intrinsic to the sensor fiber 5 and birefringence attributed to the specific fixing method used is set to 10% or less, the device can be made less susceptible to external conditions. An improvement in measurement precision can therefore be attained. When the current measurement sensitivity is set to 98% or more, i.e., the decrease in current measurement sensitivity is set to 2% or less, in particular, higher precision and stability can be realized. In this case, the allowable range of birefringence based on external conditions and required to realize a predetermined precision broadens.

In addition, since a quartz fiber having an appropriate Verdet constant is used as a current measuring instrument required for a power system, the maximum current required for measurement in the power system can be measured. In this case, the quartz fiber has a large optical elastic constant and hence is relatively susceptible to external conditions. However, as in this embodiment, by loosely fixing the fiber to the annular mount member 51, the fiber can be satisfactorily protected from external conditions.

(Seventh Embodiment)

Figure 13:
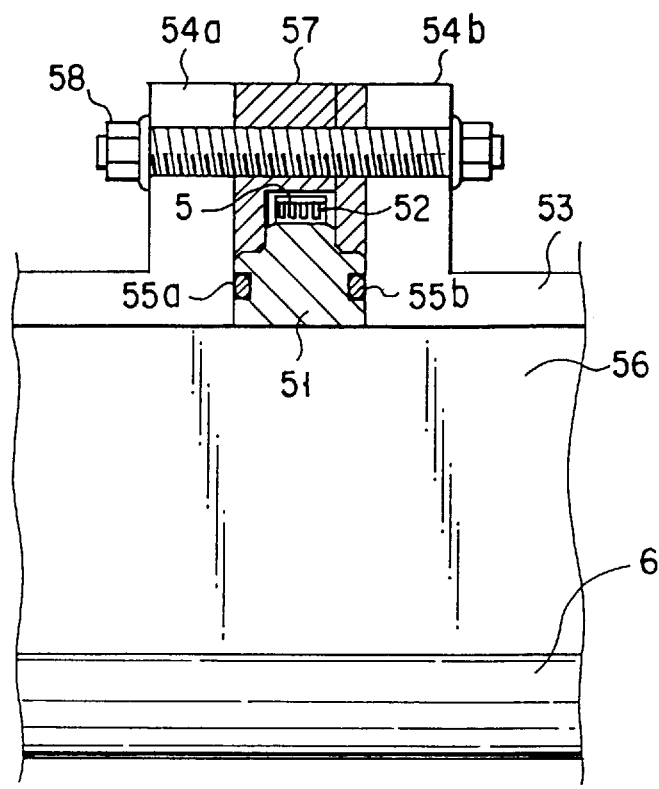
FIG. 13 is a sectional view showing a fixing structure for a sensor fiber according to the seventh embodiment of the present invention.

FIG. 13 is a sectional view showing an optical measuring device according to the seventh embodiment of the present invention, and more specifically, a fixing structure for the sensor fiber of an optical current measuring device to which conceptions 18, 28 to 30, and 32 are applied. Note that the seventh embodiment is characterized by the fixing structure for the sensor fiber, and the sensor fiber has the same arrangement as that of the sensor fiber in the sixth embodiment.

As shown in FIG. 13, a sensor fiber 5 in this embodiment is wound around an annular mount member 51 placed around a conductor 6 through which a current to be measured flows, and fixed with a sensor fixing member (fixing portion) 52 fixed to the outer circumference of the annular mount member 51. This sensor fixing member 52 includes a groove portion having a diameter larger than that of the sensor fiber 5, and a press portion for sealing the opening of the groove portion. The sensor fiber 5 is mounted in this groove portion with a margin, and loosely fixed.

The conductor 6 is housed in a tank 53 which serves as a gas-insulated unit for a power system and in which an insulating gas is sealed. The annular mount member 51 to which the sensor fiber 5 is attached is placed between two tank flanges 54a and 54b formed on the opposing end portions of the tank 53. In this case, O-rings 55a and 55b are mounted on the connection surfaces between the annular mount member 51 and the tank flanges 54a and 54b. The sensor fiber 5 is isolated from a gas area 56 including the conductor 6 through the O-rings 55a and 55b and the annular mount member 51.

The annular mount member 51 is made of an insulating material and serves as an insulating flange. A metal flange 57 for electrically and mechanically connecting the tank flanges 54a and 54b is placed outside the sensor fixing member 52 of the annular mount member 51. The metal flange 57 and the tank flanges 54a and 54b are firmly connected/fixed to each other with a bolt 58. That is, the metal flange 57 is part of the current path of the tank 53, and hence the sensor fiber 5 housed in the sensor fixing member 52 placed inside the metal flange 57 is placed within the current path of the tank 53. The sensor fiber 5 in this embodiment has the same arrangement as that of the sensor fiber 5 in the first embodiment except for the above fixing structure.

According to this embodiment having the above arrangement, the following effects can be obtained in addition to the same effects as those obtained by the sensor fiber 5 in the sixth embodiment. Since the sensor fiber 5 is placed in a space in the tank 53 which is isolated from the gas area 56, even if the temperature of the gas in the tank 53 rises upon energization of the conductor 6, this temperature rise is unlikely to affect the sensor fiber 5. In addition, since the sensor fiber 5 is placed within the current path of the tank 53, the sensor fiber 5 is hardly influenced by a current other than a current (to be measured) flowing through the conductor 6. Furthermore, since the airtightness of the tank 53 of this power system is high, the influences of external conditions can be reduced to such a degree that no problems are posed. In addition, adhesion of foreign substances such as moisture can be reliably prevented. That is, this structure provides a hermetic environment suitable for the sensor fiber 5.

According to this embodiment, therefore, the influences of external conditions on the sensor fiber 5 can be sufficiently reduced, and an improvement in measurement precision can be attained.

In the seventh embodiment, the annular mount member 51 is formed as an insulating flange. However, the annular mount member 51 may be formed as a metal flange. In this case, an insulating member must be interposed between the annular mount member 51 and the tank 53 to avoid the formation of a current path.

Figure 14:
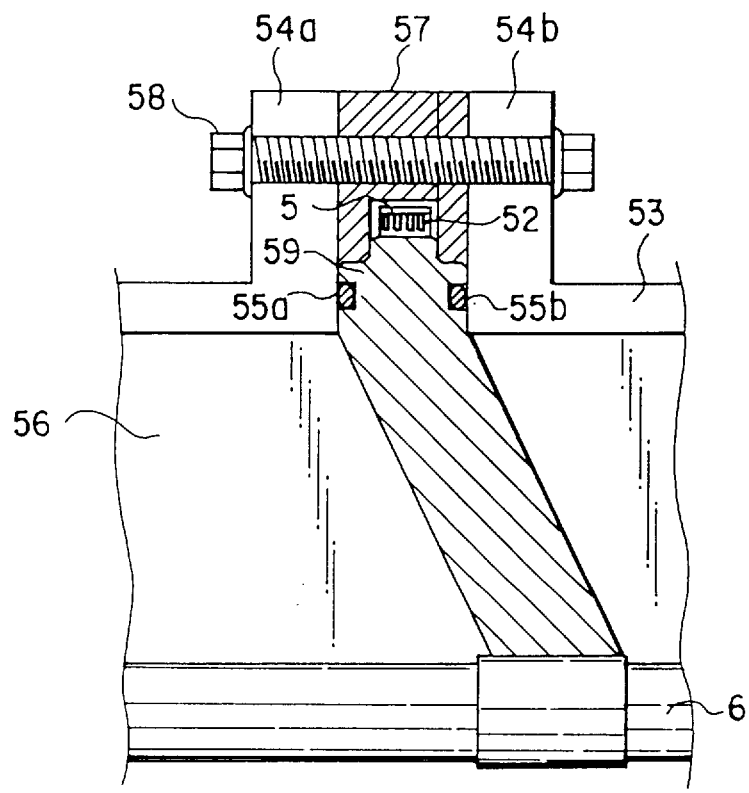
FIG. 14 is a sectional view showing a modification of the fixing structure in FIG. 13.
Figure 15A:
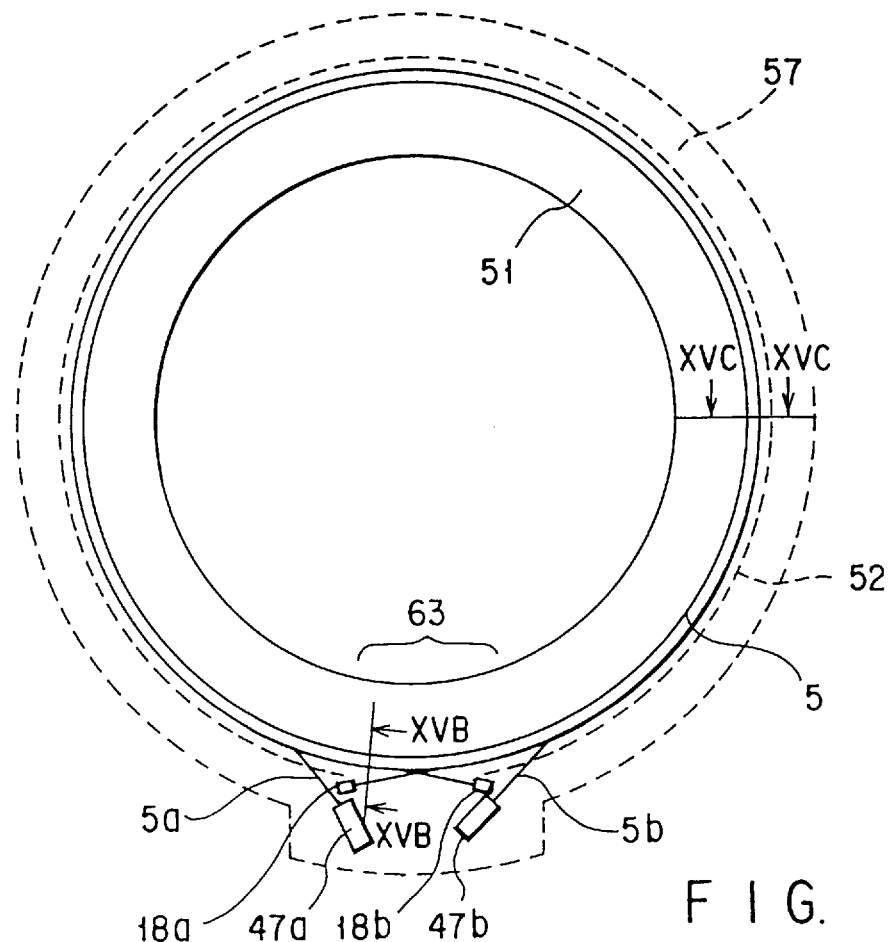
Figures 15B, 15C:
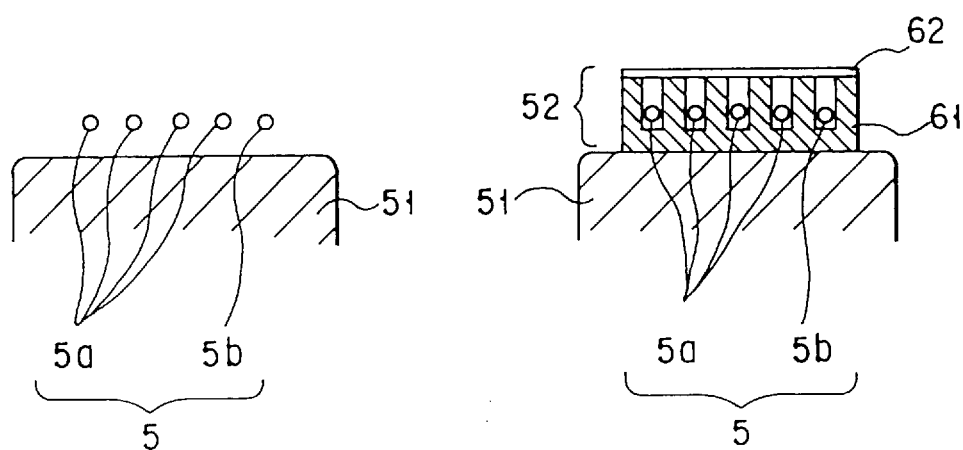
Figure 16A:
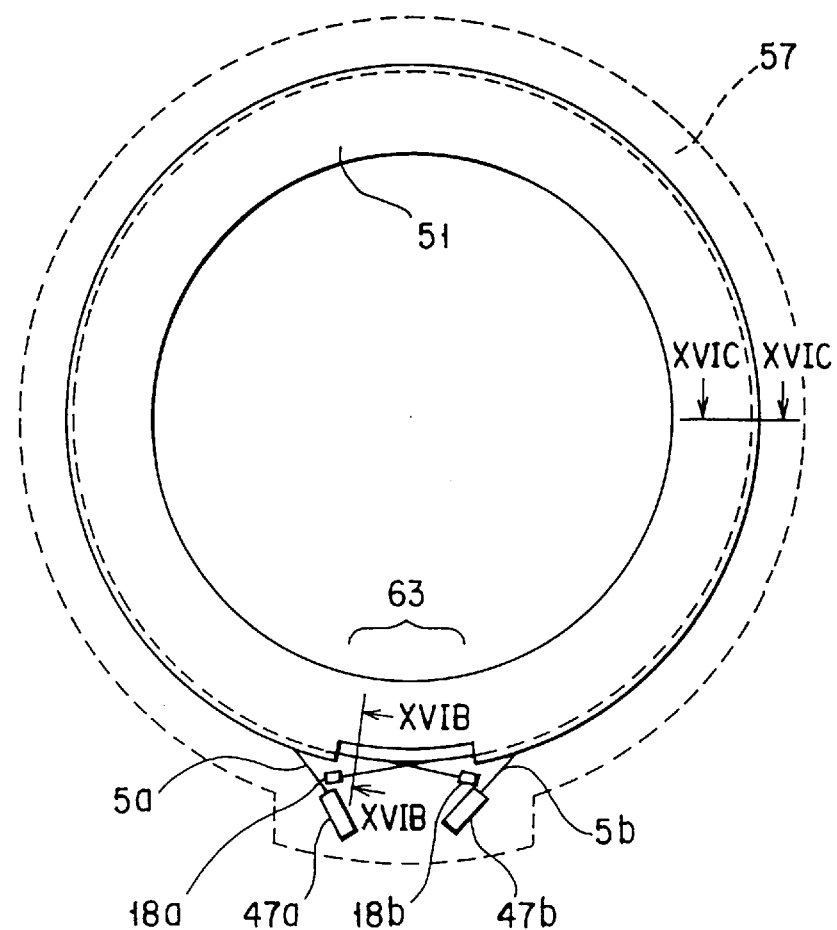
Figures 16B, 16C:
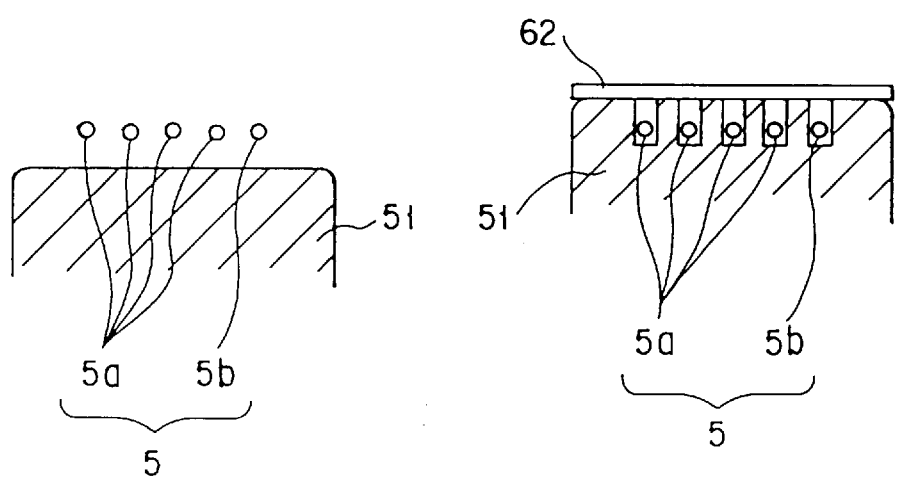
Figure 18A:
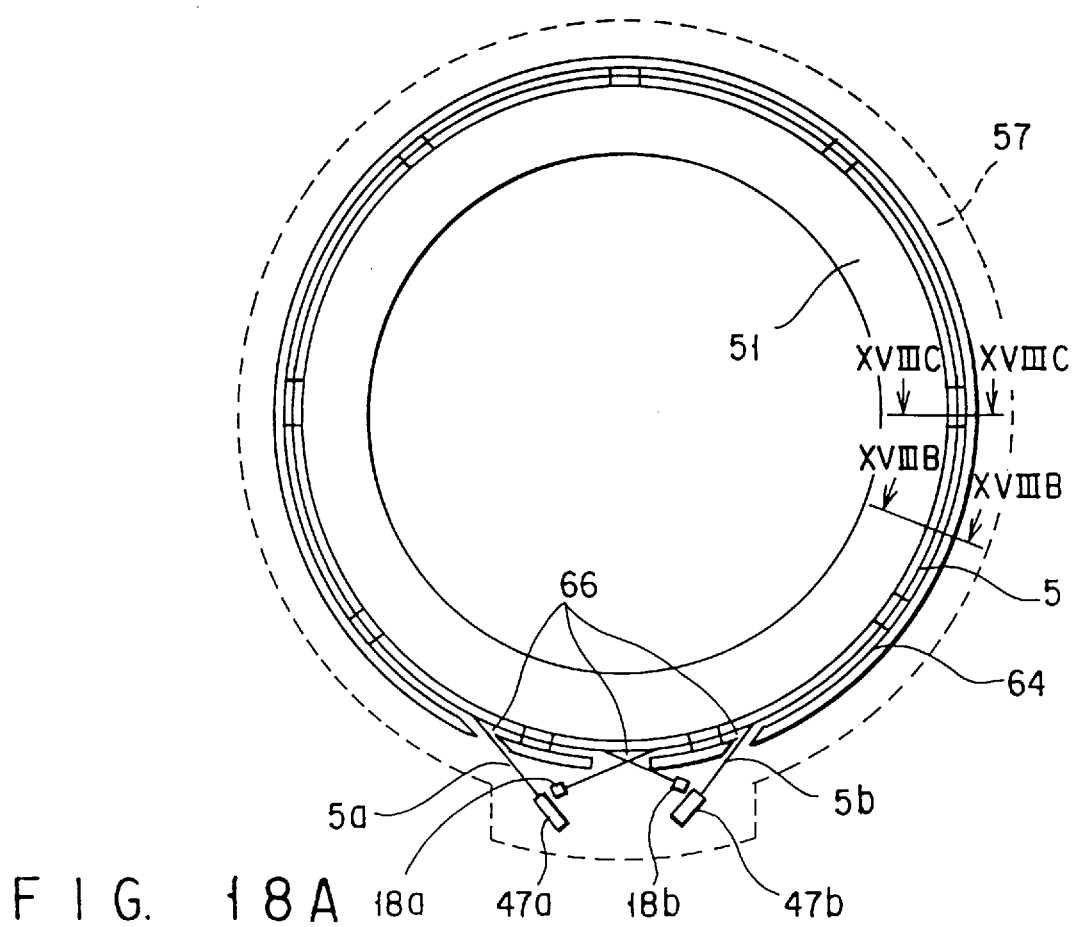
Figures 18B, 18C:
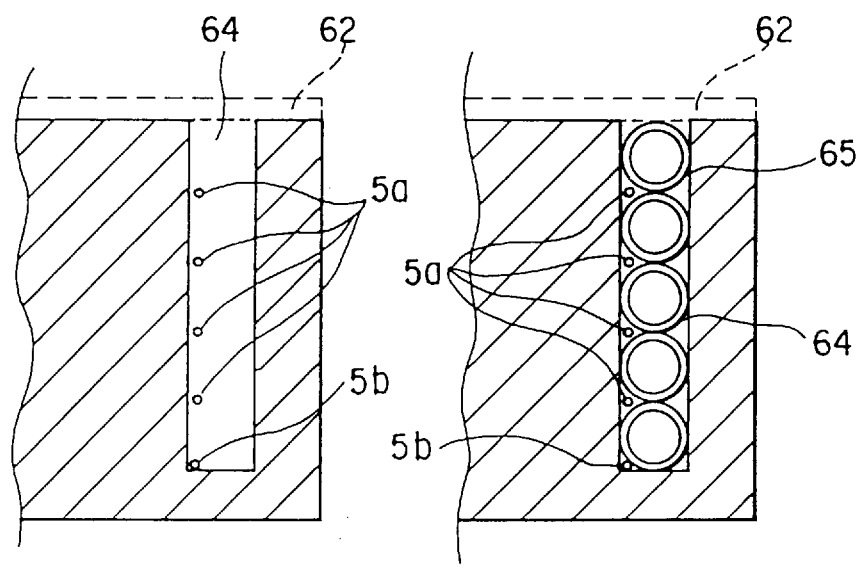

By applying conception 31, an insulating spacer 59, which is generally used for providing connection for the tank 53 or isolation of a gas area in a power system, can be used as an annular mount member, as shown in FIG. 14. Referring to FIG. 14, the sensor fixing member 52 is fixed to the outer circumferential surface of the insulating spacer 59, and the sensor fiber 5 is fixed with the sensor fixing member 52, as in the seventh embodiment. In this case, a sensor can be simply formed by only adding the sensor fixing member 52, the sensor fiber 5, and the like without forming any new flange. In addition, current measurement is facilitated. Therefore, the power system can be reduced in size and simplified, and a reduction in cost can be attained.

(Eighth Embodiment)

FIGS. 15A to 15D show an optical measuring device according to the eighth embodiment of the present invention, and more specifically, a fixing structure for the sensor fiber of an optical current measuring device to which conceptions 18, 21 to 23, 28, 29, and 32 are applied. Note that the eighth embodiment is characterized by the fixing structure for the sensor fiber, and the sensor fiber has the same arrangement as that of the sensor fiber in the sixth embodiment.

As shown in FIGS. 15A to 15D, a sensor fiber 5 in this embodiment is fixed with a sensor fixing member 52 fixed to the outer circumferential surface of an annular mount member 51. This sensor fixing member 52 includes a grooved fixing portion 61 having a plurality of isolated groove portions each having a size larger than the diameter of the sensor fiber 5, and a press portion 62 for sealing the openings of the groove portions of the grooved fixing portion 61. An area 63 in which no sensor fixing member 52 is present is provided for a portion of the annular mount member 51 in its circumferential direction. In this embodiment, since the plurality of groove portions are isolated from each other instead of being cut in the form of a helix, the area 63 in which no the sensor fixing member 52 is present is provided to allow the sensor fiber 5 to shift from a given groove portion to an adjacent groove portion when the fiber is to be wound a plurality of number of turns. Note that the grooved fixing portion 61 and the press portion 62 each consist of a metal material such as silicone rubber, an insulating material, or aluminum.

In this embodiment, two sensor fibers 5a and 5b constituting two sensors are fixed to the sensor fixing member 52. More specifically, the first sensor fiber 5a is wound four turns, and the fiber portions corresponding to the respective turns are sequentially housed in four grooves of the grooved fixing portion 61. This first sensor fiber 5a constitutes a first sensor, together with a coupling optical system 47a and a reflecting mirror 18a attached to the two ends of the fiber. The second sensor fiber 5b is wound only one turn and housed in one groove of the grooved fixing portion 61. The second sensor fiber 5b constitutes a second sensor, together with a coupling optical system 47b and a reflecting mirror 18b attached to the two ends of the fiber.

In this case, the sensor fibers 5a and 5b are fixed to the reflecting mirrors 18a and 18b and the coupling optical systems 47a and 47b, at the two end portions of each fiber, with an adhesive, and are partly fixed to the grooved fixing portion 61 with an adhesive. Fixing of the sensor fibers 5a and 5b to the grooved fixing portion 61 with an adhesive, in particular, is performed by using a flexible silicone rubber material having a low Young's modulus as an adhesive.

According to this embodiment having the above arrangement, the following effects can be obtained in addition to the effects obtained by the sensor fiber 5 in the sixth embodiment.

With the use of the grooved fixing portion 61 having the plurality of grooves, the two sensor fibers 5a and 5b can be properly and easily disposed without any interference with each other, while the respective fibers are loosely disposed. Since the two sensors can be formed altogether on the single annular mount member 51, the overall sensor structure can be reduced in size and simplified as compared with a case wherein a plurality of sensors are disposed on different mount members.

According to this embodiment, therefore, the two sensor fibers 5a and 5b constituting the two sensors can be loosely disposed without any interference with each other, and an improvement in the measurement precision of each sensor can be attained.

When the sensor fibers are fixed to the grooved fixing portion 61 with the adhesive as in the eighth embodiment, the press portion 62 can be omitted. In this case, the arrangement can be further simplified. In contrast to this, when the press portion 62 is used as in the eighth embodiment, the press portion 62 prevents the sensor fibers from being detached from the grooved fixing portion 61.

For this reason, when the press portion 62 is used, only the reflecting mirror and the coupling optical system may be fixed to the two end portions of each sensor fiber with the adhesive by applying conception 20. By decreasing the number of fixing portions of the sensor fibers with the adhesive in this manner, the sensor fibers can be fixed more loosely. In addition, press portions 62 may be distributed on the annular mount member 51 in its circumferential direction. In any case, since increases in birefringence produced by a stress accompanying a fixing process can be suppressed, a further improvement in measurement precision can be attained.

FIGS. 16A to 16D show a modification of the eighth embodiment, and more specifically, an arrangement in which groove portions are directly formed in the annular mount member 51. With this arrangement, the same effects as those of the eighth embodiment can be obtained. In addition, the number of members can be decreased to realize a simple arrangement as compared with the case wherein the sensor fixing member 52 is used.

FIGS. 17A to 17D show another modification of the eighth embodiment, and more specifically, a modification in which sensor fixing members 52 are distributed on the annular mount member 51 in its circumferential direction by applying conception 19. With this arrangement, the area 63 in which no sensor fixing member 52 is present need not be provided, and the sensor fiber 5 can be easily shifted from a given groove portion to an adjacent groove portion by using the portions between the sensor fixing members 52. In this modification as well, the same effects as those of the eighth embodiment can be obtained.

In addition, three or more sensor fibers constituting three or more sensors can be attached to the single annular mount member 51, or only one sensor fiber constituting one sensor can be attached thereto. In either case, excellent effects can be obtained.

(Ninth Embodiment)

FIGS. 18A to 18D show an optical measuring device according to the ninth embodiment of the present invention, and more specifically, a fixing structure for the sensor fibers of an optical current measuring device to which conceptions 17, 21, 22, 24 to 26, 28, 29, and 32 are applied. The ninth embodiment is characterized by the fixing structure for the sensor fiber. The sensor fiber has the same arrangement as that of the sensor fiber according to the sixth embodiment.

As shown in FIGS. 18A to 18D, in this embodiment, a groove portion 64 having an opening at the end face of an annular mount member 51 in its axial direction is formed therein to extend in the axial direction. Two sensor fibers 5a and 5b constituting two sensors are fixed in the groove portion 64. More specifically, the first sensor fiber 5a is wound four turns, and the second sensor fiber 5b is wound one turn. These sensor fibers are housed altogether in the groove portion 64. The fiber portions corresponding to the respective turns are isolated from each other by using a plurality of cylindrical guides 65 inserted in the groove portion 64. The cylindrical guides 65 are made of a fluoroplastic such as polytetrafluoroethylene, an insulating material such as silicone rubber, or a metal such as aluminum, and distributed along the circumferential direction of the annular mount member 51.

Fiber outlets/inlets 66 are formed in portions of the annular mount member 51 to draw out the two end portions of each of the sensor fibers 5a and 5b. The opening of the groove portion 64 is sealed by a press member 52. In this embodiment, the sensor fibers 5a and 5b are fixed to only reflecting mirrors 18a and 18b and coupling optical systems 47a and 47b, at the two end portions of each sensor fiber, with an adhesive, but the remaining portions are not fixed with an adhesive.

According to this embodiment having the above embodiment, the following effects can be obtained in addition to the same effects as those obtained by the sensor fiber 5 in the sixth embodiment.

The two sensor fibers 5a and 5b can be properly and easily disposed without any interference with each other, while being loosely disposed, by using the groove portion 64 directly formed in the annular mount member 51 and the plurality of cylindrical guides 65 partly inserted in the groove portion 64. Similar to the eighth embodiment, in particular, since the two sensors can be mounted altogether on the annular mount member 51, the overall arrangement of the sensors can be reduced in size and simplified as compared with a case wherein a plurality of sensors are mounted on different mount members.

According to this embodiment, therefore, similar to the eighth embodiment, the two sensor fibers 5a and 5b constituting the two sensors can be loosely disposed without any interference with each other, and the measurement precision of each sensor can be improved. In addition, since the sensor fibers 5a and 5b are fixed with the adhesive only at the two end portions of each sensor fiber, the sensor fibers 5a and 5b can be fixed more loosely. Therefore, the measurement precision can be further improved. Furthermore, the arrangement using fiber guides such as the cylindrical guides 65 is simple and allows a high degree of freedom in design. For example, the ninth embodiment may be modified such that the sensor fibers 5a and 5b are fixed with an adhesive by using the cylindrical guides 65. The arrangement of each fiber guide can be arbitrarily changed. For example, a plurality of fibers may be guided by a single fiber guide.

(10th Embodiment)

Figure 19:
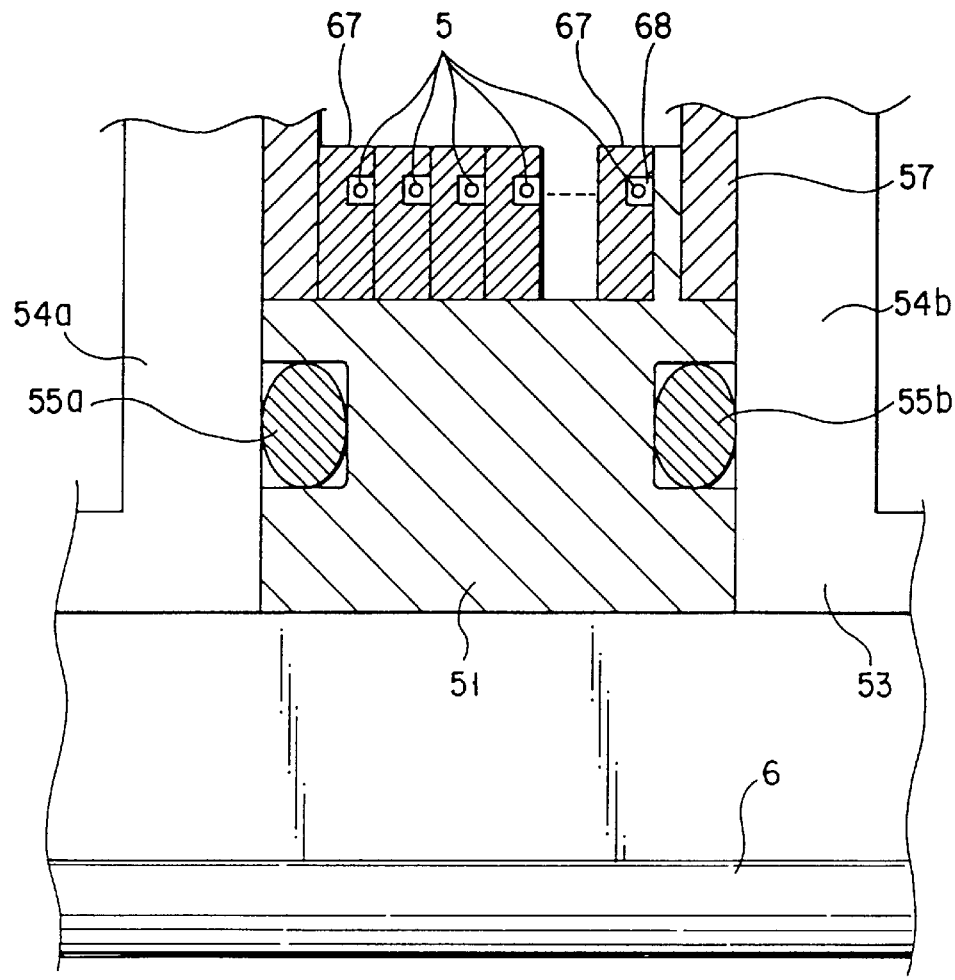
FIG. 19 is a sectional view showing a fixing structure for a sensor fiber according to the 10th embodiment of the present invention.
Figure 20:
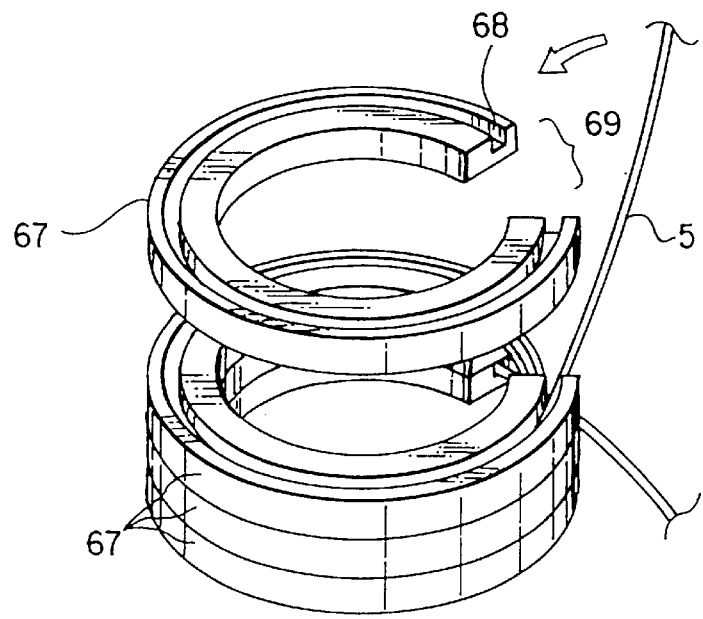
FIG. 20 is a perspective view showing a method of mounting the sensor fiber in the fixing structure in FIG. 19.

FIGS. 19 and 20 show an optical measuring device according to the 10th embodiment of the present invention, and more specifically, a fixing structure for the sensor fiber of an optical current measuring device to which conceptions 18, 21, 23, 27 to 29, and 32 are applied. The 10th embodiment is characterized by the fixing structure for the sensor fiber. The sensor fiber has the same arrangement as that of the sensor fiber in the sixth embodiment.

As shown in FIG. 19, in this embodiment, a plurality of disk-like housing portions 67 are stacked/disposed on the outer circumferential surface of an annular mount member 51 in the axial direction. In this case, each disk-like housing portion 67 has one groove portion 68 in one end face in the axial direction. A sensor fiber 5 is wound around the annular mount member 51 a plurality of turns. The fiber portions corresponding to the respective turns are housed in the respective groove portions 68.

More specifically, as shown in FIG. 20, a notched portion 69 is formed in a portion of each disk-like housing portion 67 in the circumferential direction for the same purpose as that of the area 63 in which no sensor fixing member 52 is present in the eighth embodiment. That is, the notched portions 69 are formed to allow the sensor fiber 5 housed in the groove portion 68 of a given disk-like housing portion 67 to be shifted into the groove portion 68 of an adjacent disk-like housing portion 67. Similar to the ninth embodiment, the sensor fiber 5 is fixed with an adhesive only at its two end portions, but the remaining portions are not fixed with an adhesive.

According to this embodiment having the above arrangement, the following effects can be obtained in addition to the same effects as those obtained by the sensor fiber 5 in the sixth embodiment. As shown in FIG. 20, while the fiber portions of the sensor fiber 5 which correspond to the respective turns are housed in the respective groove portions 68, the disk-like housing portions 67 are sequentially stacked on each other. With this arrangement, the fiber portions of the sensor fiber 5 which correspond to the respective turns can be properly and easily disposed without any interference with each other while being disposed loosely.

According to this embodiment, therefore, similar to the eighth and ninth embodiments, the fiber portions of the sensor fiber 5 which correspond to the respective turns can be disposed loosely without any interference each other, thereby attaining an improvement in measuring precision. In addition, similar to the ninth embodiment, since the sensor fiber 5 is fixed with the adhesive only at the two end portions, the sensor fiber 5 can be fixed more loosely, thereby attaining a further improvement in measurement precision. Furthermore, since these disk-like housing portions 67 can be standardized, the fixing structure can be simplified. Since the design can be easily changed by increasing/decreasing the number of disk-like housing portions 67 to be stacked, in particular, this structure excels in practicability. For example, the 10th embodiment may be modified such that the respective disk-like housing portions 67 are fixed to each other with an adhesive. Furthermore, similar to the eighth and ninth embodiments, a plurality of sensor fibers constituting a plurality of sensors may be mounted integrally.

The present invention is not limited to the above embodiments, and may be practiced in various forms. For example, in the first and sixth embodiments, the present invention is applied to the optical system based on the scheme in which light travels through a sensor fiber two ways. However, the present invention can be applied to an optical system based on a scheme in which light travels through a sensor fiber only one way. In this case as well, excellent effects can be obtained. In addition, the present invention is not limited to an optical current measuring device. The present invention can be applied to various types of optical measuring devices for measuring various types of physical quantities by using optical systems including optical fibers. In such a case as well, excellent effects can be obtained.

As has been described above, according to the present invention, the method of manufacturing an optical system and the arrangement of an optical system are improved, the arrangements of an optical fiber, a focusing means for sending light to the optical fiber, and a reception fiber are improved, and the fixing structure for a sensor fiber is improved, thereby providing a highly practical optical measuring device which exhibits high precision and stability for a long period of time as compared with the conventional device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A device for optically measuring a physical quantity in power equipment, comprising:

an optical fiber associated with the power equipment;

an optical part for transmitting/receiving light to/from said optical fiber;

calculation means for calculating a physical quantity in the power equipment by detecting a polarized state of light polarized by the power equipment on the basis of an output from said optical part;

a housing box being made of a magnetic metal, for housing said optical part; and a fixing member to which said optical part is mounted and which is fixed to said housing box by laser welding using a metal containing no phosphorus.

2. A device according to claim 1, wherein the magnetic metal is nickel alloy steel.

3. A device according to claim 1, wherein said optical part includes focusing means for sending light to the optical fiber.

4. A device according to claim 3, wherein said focusing means have a spot size of light incident on the end face of the optical fiber of the focusing means set to be $2^{1/2}$ times or greater the core diameter of the optical fiber.

5. A device according to claim 3, wherein said focusing means have a spot size of light incident on the end face of the optical fiber of the focusing means set to be $2^{-1/2}$ times or less the core diameter of the optical fiber.

6. A device according to claim 3, wherein said focusing means have a distributed index lens.

7. A device according to claim 6, further comprising:

a fiber connector for supporting the fiber end portion placed at the end portion of the optical fiber, and wherein the lens has the same diameter as that of the fiber connector.

8. A device according to claim 3, wherein said focusing means comprises a lens, and the focal point of the lens is set to coincide with an end face of the lens.

9. A device according to claim 8, further comprising:

a fiber connector for supporting the fiber end portion placed at the end portion of the optical fiber, and wherein the lens has the same diameter as that of the fiber connector.

10. A device according to claim 1, wherein said optical part comprises:

a sensor optical element;

an analyzer through which transmitted light undergoes a change in amount depending on the polarized state of the light emerging from the sensor optical element;

a reception optical fiber for guiding the light transmitted through the analyzer; and a focusing means for sending light to the reception optical fiber.

11. A device according to claim 10, wherein said reception optical fiber comprises a multimode optical fiber having a core diameter of 100 μm or more.

12. A device according to claim 11, wherein said multimode optical fiber is made of multi-component glass.

13. A device according to claim 11, wherein said multimode optical fiber has a core, said core of the multimode optical fiber is made of quartz, and the cladding is made of a plastic material.

14. A device according to claim 10, wherein said reception optical fiber comprises a multimode optical fiber having an NA of 0.25 or more.

15. A device according to claim 14, wherein said multimode optical fiber is made of multi-component glass.

16. A device according to claim 14, wherein said multimode optical fiber has a core, said core of the multimode optical fiber is made of quartz, and the cladding is made of a plastic material.

17. A device for optically measuring a physical quantity in power equipment including at least a tank and a bus trunk arranged in the tank together with a gas by using an optical fiber, comprising:

a mount member having an annular shape to oppose an end portion of the tank, arranged for the power equipment, having a size larger than a diameter of said optical fiber, and having a fixing portion in which a groove portion in which said optical fiber is housed is formed;

said optical fiber housed in the groove portion of the fixing portion of said mount member; and means for detecting a polarized state of light polarized by the power equipment by transmitting/receiving light to/from said optical fiber, and calculating a physical quantity in the power equipment on the basis of the detection output;

wherein the fixing portion comprises fixing portions distributed at a plurality of portions in a circumferential direction of said annular mount member.

18. A device for optically measuring a physical quantity in power equipment including at least a tank and a bus trunk arranged in the tank together with a gas by using an optical fiber, comprising:

a mount member having an annular shape to oppose an end portion of the tank, arranged for the power equipment, having a size larger than a diameter of said optical fiber, and having a fixing portion in which a groove portion in which said optical fiber is housed is formed;

said optical fiber housed in the groove portion of the fixing portion of said mount member; and means for detecting a polarized state of light polarized by the power equipment by transmitting/receiving light to/from said optical fiber, and calculating a physical quantity in the power equipment on the basis of the detection output;

wherein the fixing portion comprises guide fiber portions for isolating portions of said optical fiber housed in the groove portion from each other, and guiding the isolated fiber portions; and the guide portions comprise a plurality of cylindrical guides disposed between the fiber portions.

19. A device for optically measuring a physical quantity in power equipment including at least a tank and a bus trunk arranged in the tank together with a gas by using an optical fiber, comprising:

a mount member having an annular shape to oppose an end portion of the tank, arranged for the power equipment, having a size larger than a diameter of said optical fiber, and having a fixing portion in which a groove portion in which said optical fiber is housed is formed;

said optical fiber housed in the groove portion of the fixing portion of said mount member; and means for detecting a polarized state of light polarized by the power equipment by transmitting/receiving light to/from said optical fiber, and calculating a physical quantity in the power equipment on the basis of the detection output;

wherein the fixing portion comprises a plurality of disk-like housing portions stacked on each other, each of said disk-like housing portions including the groove portion in one end face.

* * * * *